US010790652B2

(12) United States Patent
Okura et al.

(10) Patent No.: US 10,790,652 B2
(45) Date of Patent: Sep. 29, 2020

(54) OPERATION DEVICE

(71) Applicant: Mitsubishi Electric Corporation, Tokyo (JP)

(72) Inventors: Kenichiro Okura, Tokyo (JP); Yoshiteru Murata, Tokyo (JP); Mitsuhiro Sugimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/465,812

(22) PCT Filed: Jan. 31, 2017

(86) PCT No.: PCT/JP2017/003476
§ 371 (c)(1),
(2) Date: May 31, 2019

(87) PCT Pub. No.: WO2018/142488
PCT Pub. Date: Aug. 9, 2018

(65) Prior Publication Data
US 2019/0341760 A1 Nov. 7, 2019

(51) Int. Cl.
*H05K 5/00* (2006.01)
*H02G 3/08* (2006.01)
(Continued)

(52) U.S. Cl.
CPC ............ *H02G 3/088* (2013.01); *F24F 13/20* (2013.01); *H02G 15/013* (2013.01); *H02G 15/10* (2013.01); *F24F 2013/207* (2013.01)

(58) Field of Classification Search
USPC ....................................... 361/752, 796, 800
See application file for complete search history.

(56) References Cited

U.S. PATENT DOCUMENTS

| 6,362,953 | B1 * | 3/2002 | Ohlwine | ............. H05K 5/0017 |
| | | | | 312/223.2 |
| 9,989,273 | B2 * | 6/2018 | Read | ......................... F24F 11/89 |
| 2003/0102143 | A1 | 6/2003 | Sato et al. | |

FOREIGN PATENT DOCUMENTS

| JP | S63-76075 U | 5/1988 |
| JP | S63-173483 A | 7/1988 |

(Continued)

OTHER PUBLICATIONS

International Search Report of the International Searching Authority dated May 9, 2017 for the corresponding international application No. PCT/JP2017/003476 (and English translation).

(Continued)

*Primary Examiner* — Hung S. Bui
(74) *Attorney, Agent, or Firm* — Posz Law Group, PLC

(57) ABSTRACT

An operation device includes a control board, a case, a base member, and a protective cover located inside the case and protecting the control board by separating, inside the case, a space defined by the base member and the case into a first space for the control board and a second space exposed to the base member. The base member has an annular rib surrounding an installation hole. The protective cover has, on a surface facing the base member, a recess in an area corresponding to the rib. The rib is fitted in the recess with a leading edge in contact with the bottom of the recess. A screw inserted in the hole has a head inside a third space defined by the rib and the bottom of the recess.

14 Claims, 24 Drawing Sheets

(51) Int. Cl.
*F24F 13/20* (2006.01)
*H02G 15/013* (2006.01)
*H02G 15/10* (2006.01)

(56) References Cited

FOREIGN PATENT DOCUMENTS

| | | | |
|---|---|---|---|
| JP | S63-177083 | U | 11/1988 |
| JP | H03-155196 | A | 7/1991 |
| JP | H07-189555 | A | 7/1995 |
| JP | H09-130061 | A | 5/1997 |
| JP | 2000-013051 | A | 1/2000 |
| JP | 2000-270422 | A | 9/2000 |
| JP | 2003-226346 | A | 8/2003 |
| JP | 2010-050420 | A | 3/2010 |
| JP | 2010-266117 | A | 11/2010 |
| JP | 2015-076431 | A | 4/2015 |
| JP | 2015-140945 | * | 8/2015 |
| WO | 2018/142489 | A1 | 8/2018 |

OTHER PUBLICATIONS

Office Action dated Jul. 10, 2018 issued in corresponding JP patent application No. 2018-525793 (and English translation).
Office Action dated Sep. 18, 2018 issued in corresponding JP patent application No. 2018-525793 (and English translation).

* cited by examiner

OPERATION DEVICE

CROSS REFERENCE TO RELATED APPLICATION

This application is a U.S. national stage application of International Patent Application No. PCT/JP2017/003476 filed on Jan. 31, 2017, the content of which is incorporated herein by reference.

TECHNICAL FIELD

The present disclosure relates to an operation device.

BACKGROUND

A wall mounted operation device for remote control of indoor equipment has been proposed (see, for example, Patent Literature 1). This operation device includes a rear case and a front case. The operation device is installed on a wall by first attaching the rear case to the wall and then fastening the front case accommodating an electrical component board to the rear case. The rear case is attached to the wall with screws inserted through openings in a rear plate of the rear case.

PATENT LITERATURE

Patent Literature 1: Unexamined Japanese Patent Application Kokai Publication No. 2010-266117

The operation device described in Patent Literature 1 has a space defined by the rear case and the front case, and a screw for attaching the rear case to the wall is disposed with the head of the screw exposed in the space. In winter, for example when the temperature inside a wall of a building differs from the temperature inside the building, heat is released through the screw into the wall, which cools the screw. Moisture in the air then condenses into water on the head of the cooled screw. In this case, the water generated on the head of the screw may enter the front case accommodating the component board, thereby causing corrosion of the component board and malfunction of the operation device.

In light of the above circumstances, one or more aspects of the present disclosure are directed to an operation device that reduces malfunctioning due to condensation on the head of a screw for installing an operation device body on a wall.

SUMMARY

An operation device according to an aspect of the present disclosure includes a control board, a case, a base member, and a protective cover. An electronic component is mounted on the control board. The case accommodates the control board. The base member has an installation hole to receive a screw for installation to a structural material and an annular rib surrounding the installation hole. The case is fastened to the base member. The protective cover is located inside the case to protect the control board by separating, inside the case, a space defined by the base member and the case into a first space accommodating the control board and a second space partially defined by the base member. The protective cover has, on a surface facing the base member, a recess in an area corresponding to the rib. The rib is fitted in the recess with a leading edge of the rib in contact with a bottom of the recess, and a part of the screw inserted through the installation hole is located in a third space defined by the rib and the protective cover.

In the operation device according to the present disclosure, the protective cover is located inside the case and protects the control board by separating, inside the case, the space defined by the base member and the case into the first space for the control board and the second space partially defined by the base member. The protective cover has, on the surface facing the base member, the recesses in areas corresponding to the ribs. The rib is fitted in the recess with a leading edge of the rib in contact with the bottom of the recess. The part of the screw inserted in the installation hole is located in the third space defined by the rib and the protective cover. This prevents water resulting from condensation on the part of the screw in the third space from entering the second space. In other words, when the base member is installed on the wall, water resulting from condensation inside the operation device body and condensation on a part of the screw is less likely to enter the second space, thus reducing malfunctioning of the operation device. This also reduces an inflow of air in the third space into the second space. The air in the third space is cooled by heat transfer to the wall through the screw, and thus the reduction of the inflow reduces condensation inside the operation device body.

DETAILED DESCRIPTION

Embodiment 1

An operation device according to one or more embodiments of the present disclosure is described below with reference to the drawings.

Figure 1:
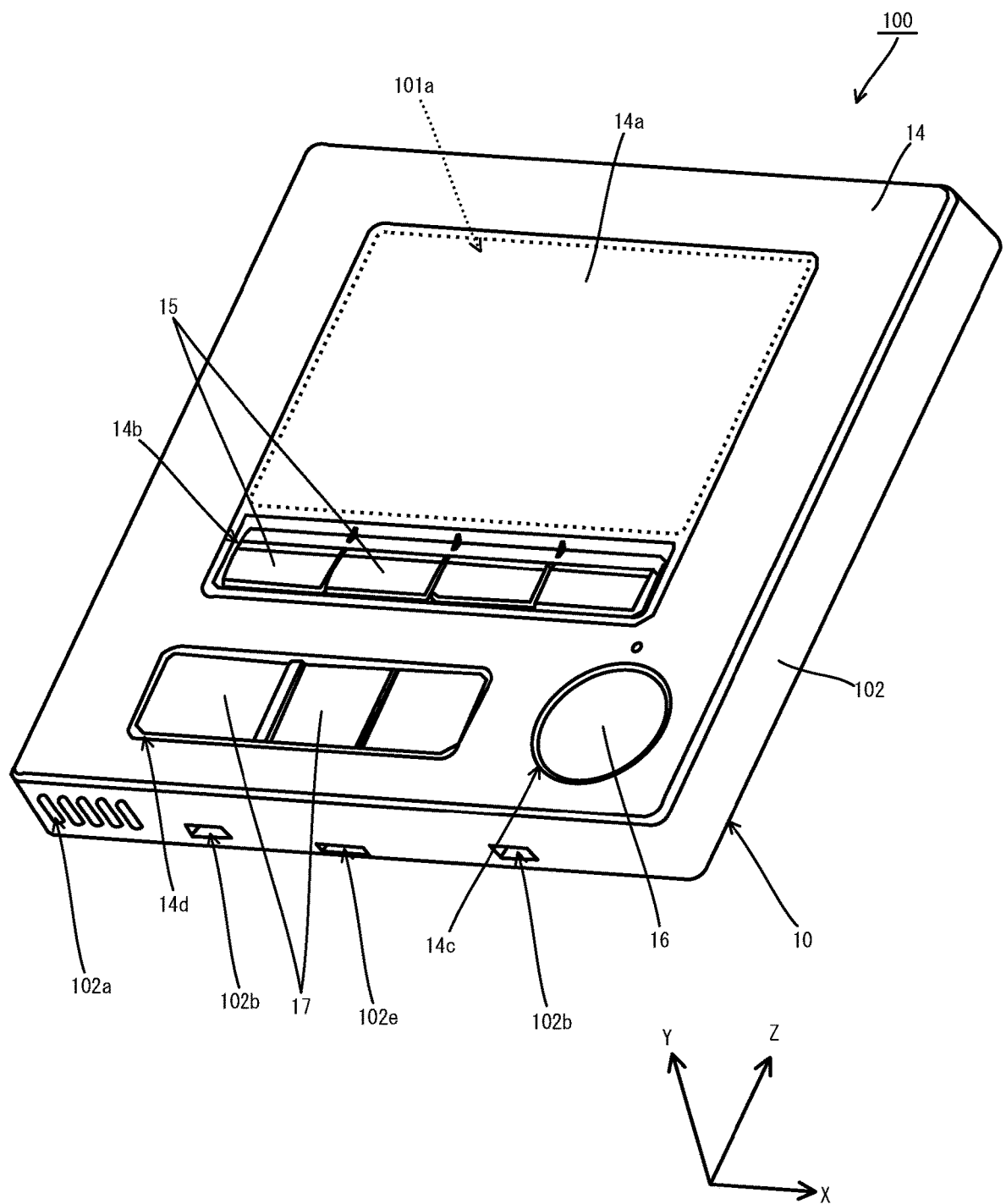
FIG. 1 is an external perspective view of an operation device viewed from the front according to Embodiment 1 of the present disclosure.
Figure 2:
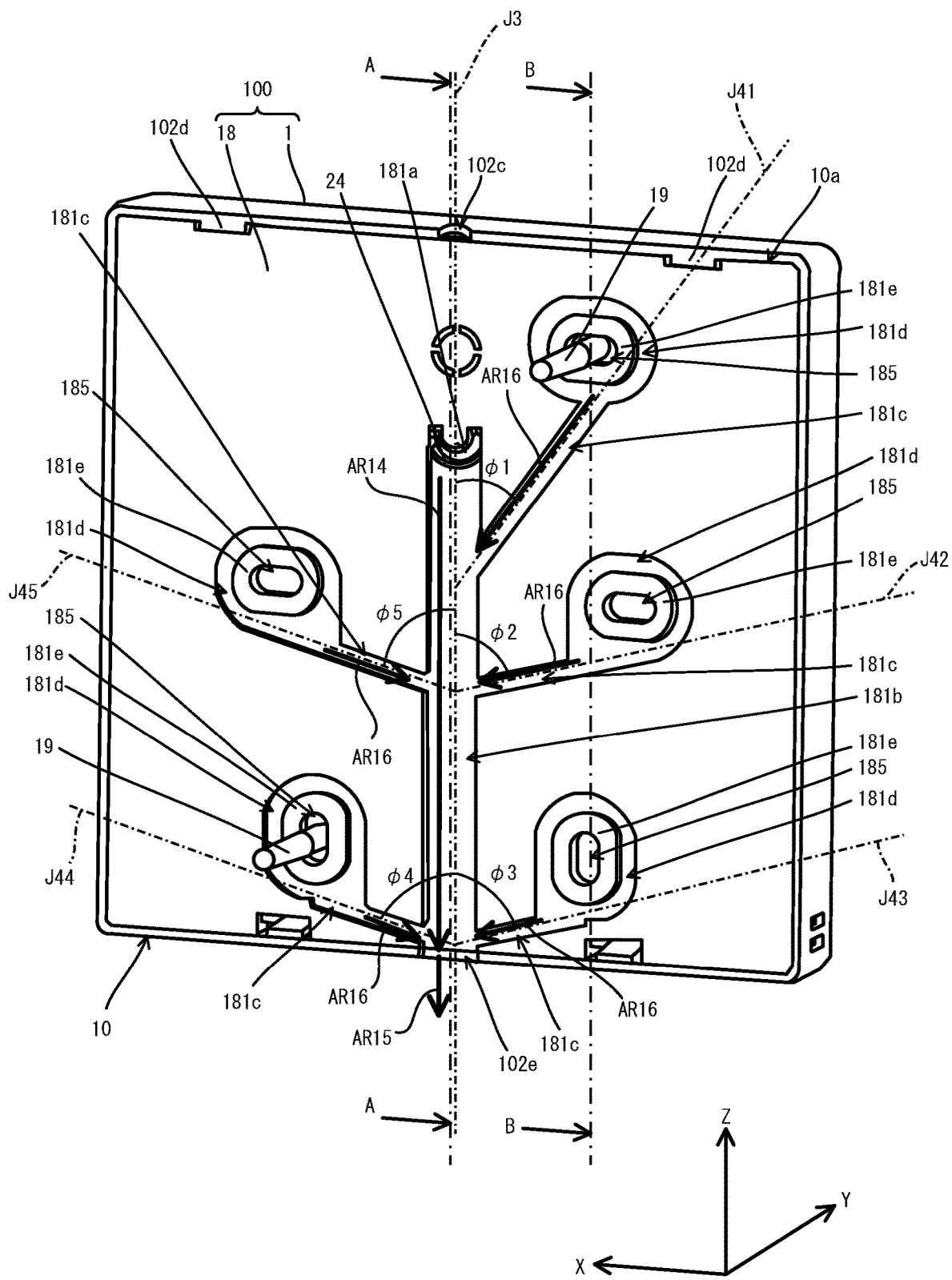
FIG. 2 is an external perspective view of the operation device viewed from the rear according to Embodiment 1.
Figure 3:
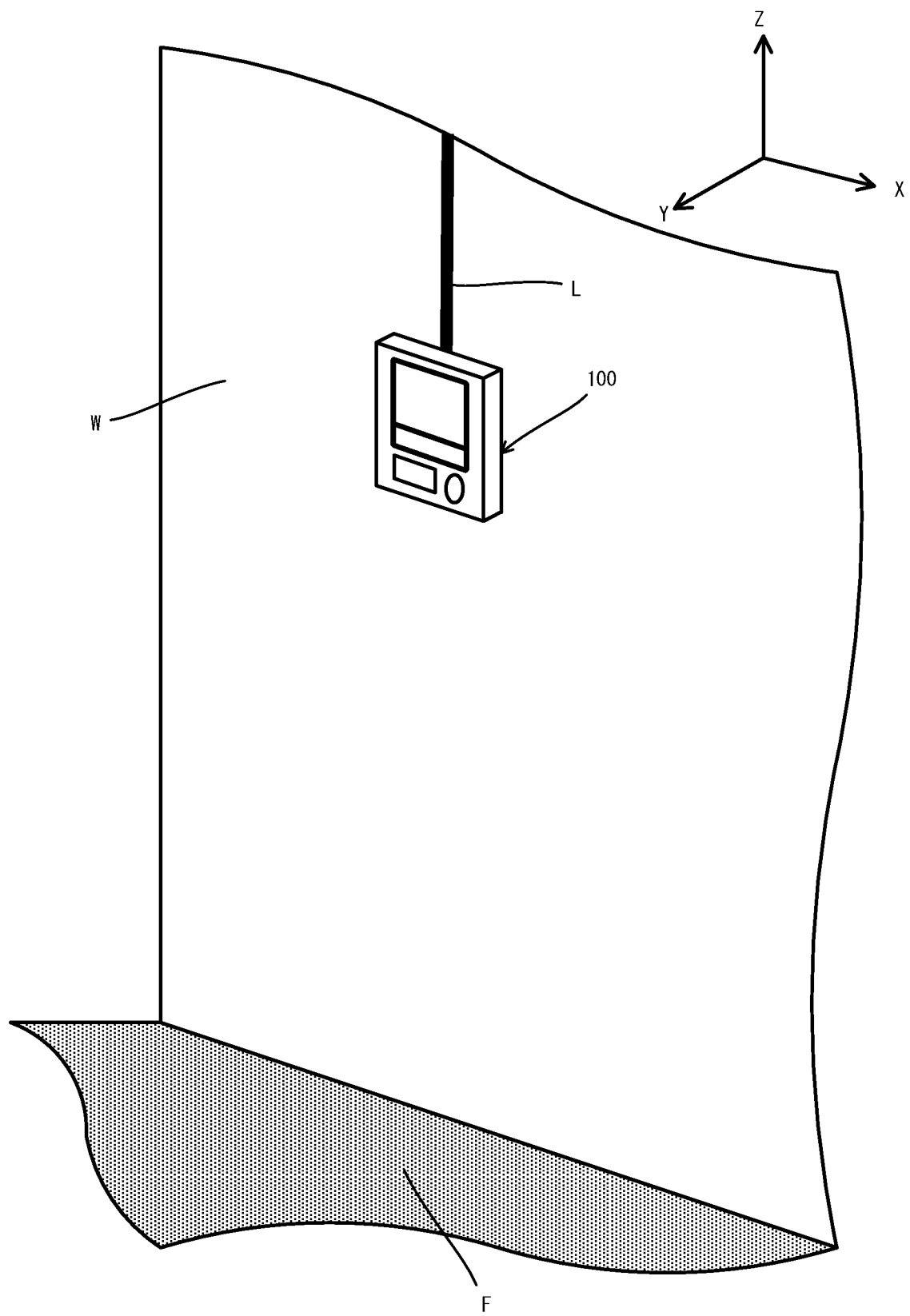
FIG. 3 is a diagram illustrating an example of wall mounting of the operation device according to Embodiment 1.

An operation device according to Embodiment 1 is installed, for example, on a wall of a building and connected to an operation target, such as an air conditioner (not shown), through a signal line. This operation device controls the operation target by transmitting to the operation target a control signal corresponding to a user operation. As shown in FIGS. 1 and 2, an operation device 100 includes an operation device body 1 and a base member 18 for installing the operation device body 1 on a wall (structural material). As shown in FIG. 3, the operation device 100 is fixed to a wall W, and a signal line L for communication with the air conditioner is connected to an upper end of the operation device 100. Hereinafter, as appropriate, the vertically upward direction of the operation device 100 installed on the wall W as shown in FIG. 3 is referred to as a +Z direction, and the vertically downward direction of the operation device 100 is referred to as a −Z direction. Further, a direction parallel to the wall W and perpendicular to the vertical direction of the wall W is referred to as an X direction, and a direction orthogonal to the wall W is referred to as a Y direction. Further, in the following description, a +Y-direction side is also referred to as a front side, and a −Y-direction side is also referred to as a rear side.

Figure 4:
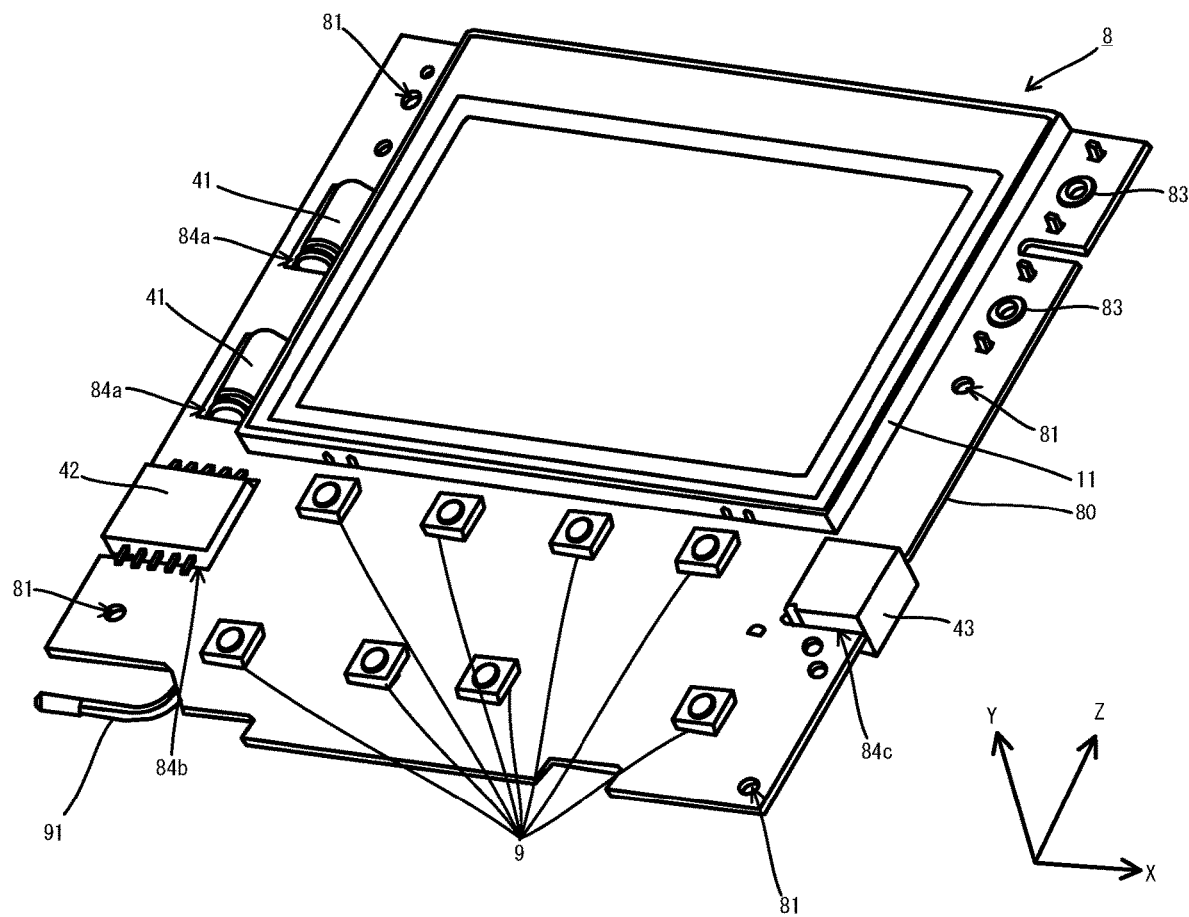
FIG. 4 is a perspective view of a control board viewed from the front according to Embodiment 1.
Figure 5:
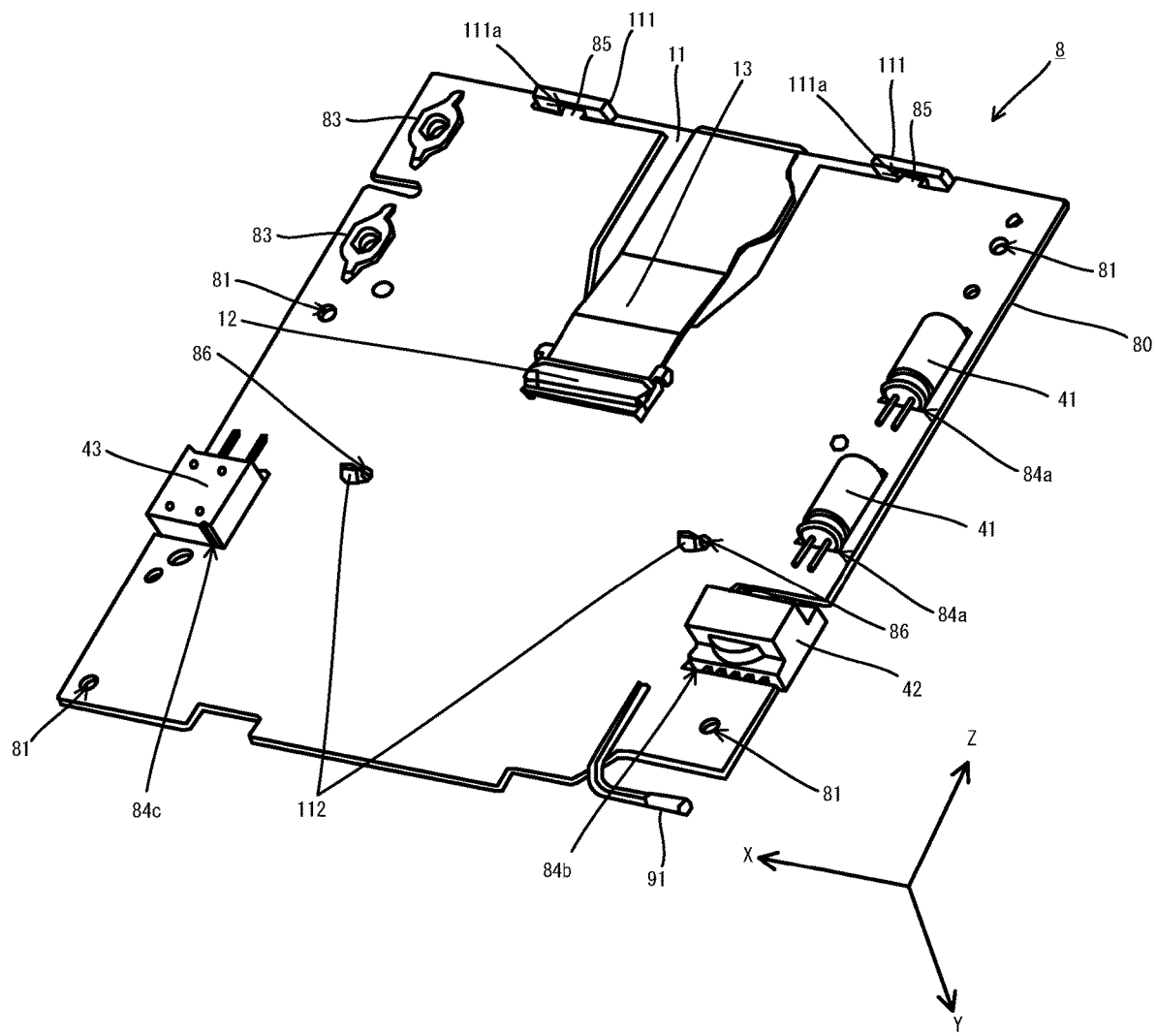
FIG. 5 is a perspective view of the control board viewed from the rear according to Embodiment 1.
Figure 6:
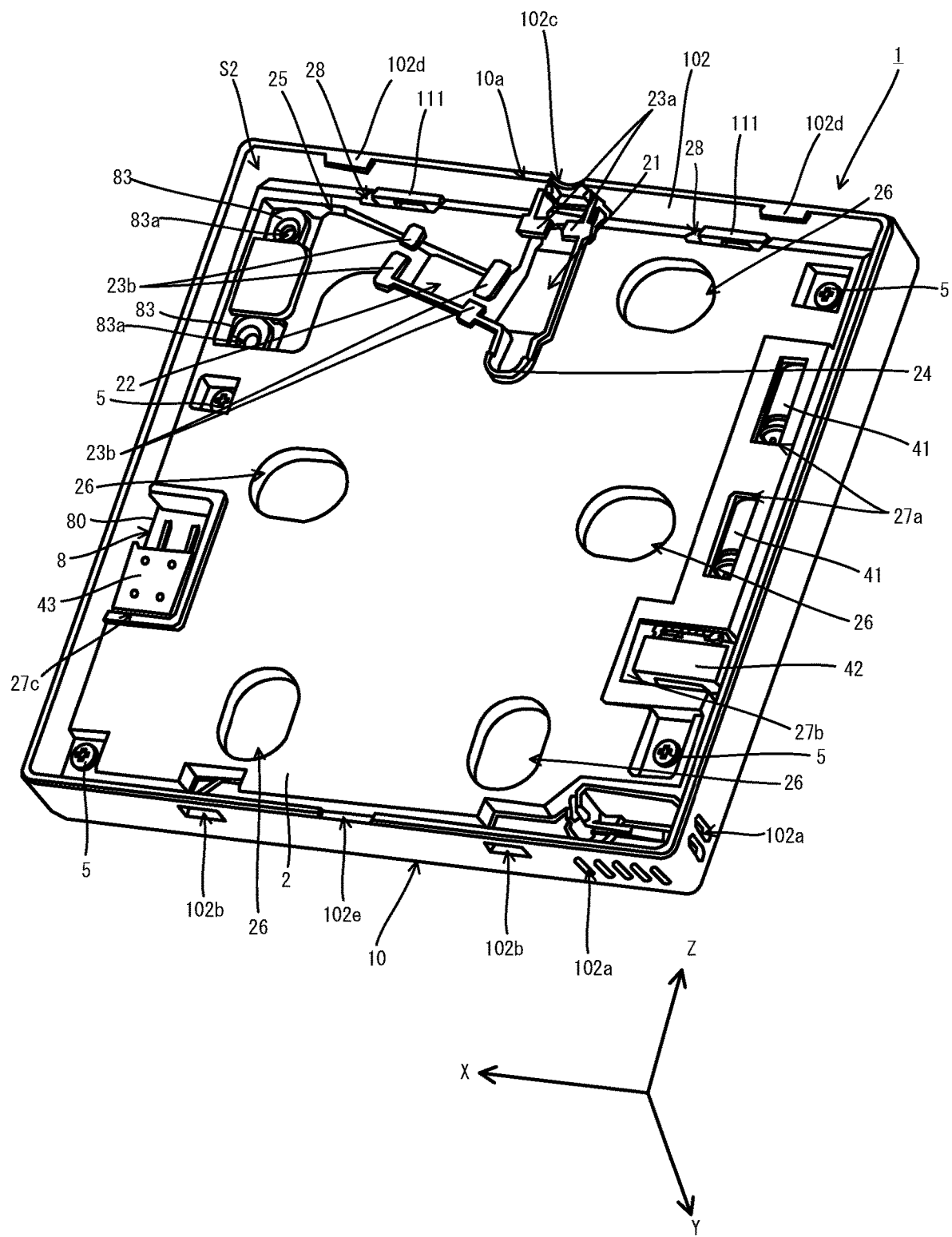
FIG. 6 is a perspective view of an operation device body according to Embodiment 1, with a base member removed.

As shown in FIG. 1, the operation device body 1 includes a case 10 having a shape of a flat rectangular box, and a front panel 14 fastened to the front face of the case 10. The operation device body 1 further includes a control board 8 that controls the operation device, and a display module 11 that displays a screen for operation, as shown in FIGS. 4 and 5. The control board 8 and the display module 11 are accommodated in the case 10. As shown in FIG. 6, the operation device body 1 further includes a protective cover 2 for protection of the control board 8. The protective cover 2 covers the control board 8 on an opening side of the case 10 accommodating the control board 8.

The case 10 has an open face on the rear side (in the −Y-direction side in FIG. 6), and has an inlet cutout 102c that is a port for receiving the signal line L on an upper side of a peripheral wall 102. More specifically, the peripheral wall 102 of the case 10 at shipment, for example, has on the upper side a thin portion having a smaller thickness than other portions, in which the inlet cutout 102c is to be formed. A worker who installs the operation device 100 cuts the thin portion of the case 10 as appropriate in accordance with the thickness of the signal line L to form the inlet cutout 102c. An opening 10a of the case 10 is covered by the base member 18 when the operation device 100 is installed on the wall W.

Figure 7:
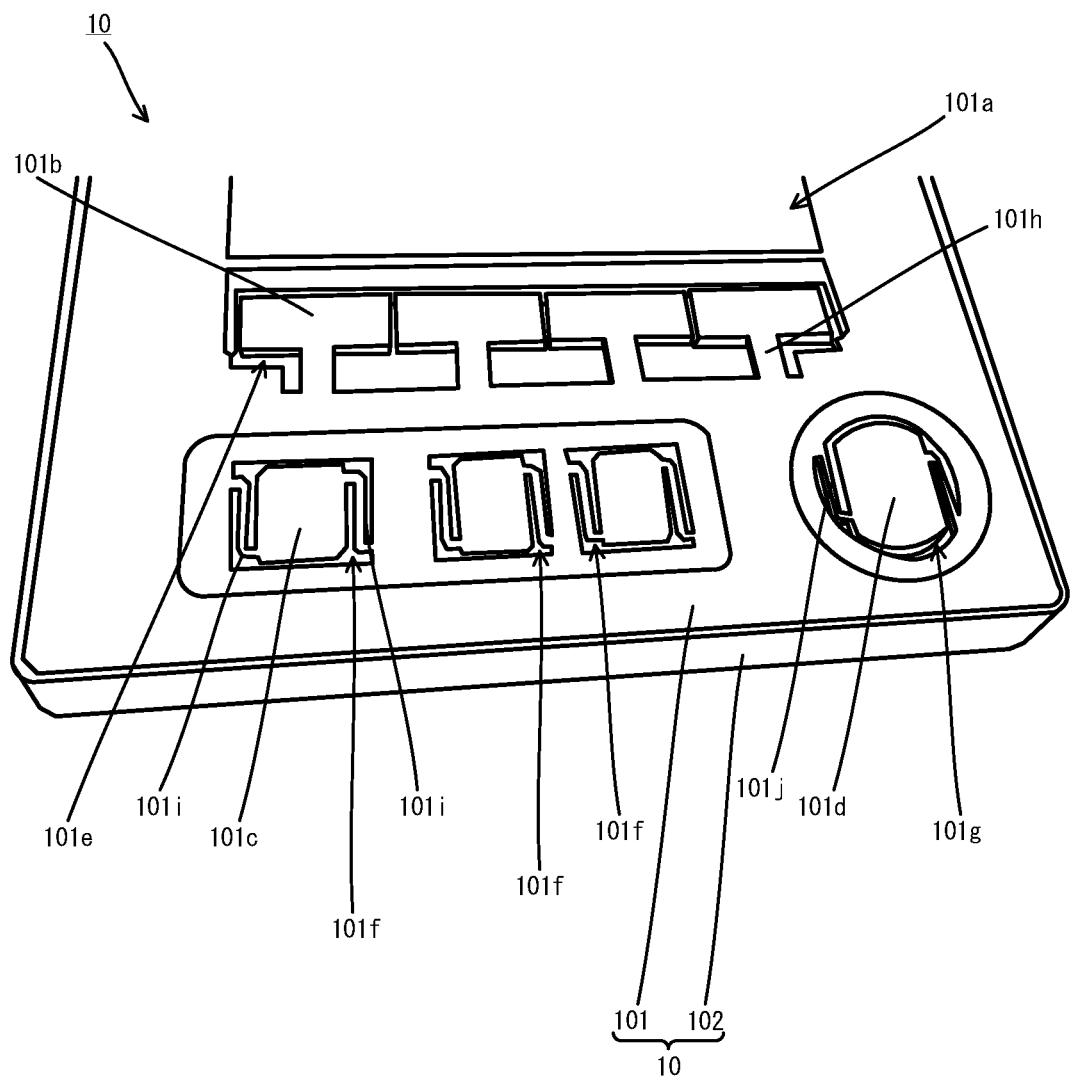
FIG. 7 is a partial perspective view of a case according to Embodiment 1 viewed from the front, with a front panel removed.

As shown in FIG. 7, a bottom wall 101 of the case 10 has an opening 101a that is rectangular in a plan view. Images displayed on the display module 11 are viewable in front of the case 10 through the opening 101. FIG. 7 shows the case 10 with the front panel 14 removed as viewed from in front of the case 10. The case 10 has, on the front face, function keys 15, operation keys 17, and a power button 16, which are pressed by a user operating the air conditioner. The operation keys 17 are used, for example, to select an operation command menu for the air conditioner and enter an operation command. The bottom wall 101 has mounts 101b, 101c, and 101d, to which the function keys 15, the operation keys 17, and the power button 16 shown in FIG. 1 are attached. The mounts 101b, 101c, and 101d connect through flexible portions 101h, 101i, and 101j to the peripheries of openings 101e, 101f, and 101g in the bottom wall 101, respectively. Thus, the function keys 15, the operation keys 17, and the power button 16 attached to the mounts 101b, 101c, and 101d are movable back and forth as the flexible portions 101h, 101i, and 101j bend.

As shown in FIG. 1, the peripheral wall 102 of the case 10 has slits 102a exposed outside the case 10 and engagement holes 102b in which the case 10 is engaged with the base member 18. The slits 102a allow air outside the case 10 to be taken in for measurement of the outside temperature. As shown in FIG. 6, the peripheral wall 102 has, in its upper portion, engagement tabs 102d that protrude in the −Z direction to be engaged with the base member 18. The peripheral wall 102 further has, in its lower portion, a drain cutout 102e for draining water inside the case 10.

Referring back to FIG. 1, the front panel 14 is a rectangular plate placed over the front side of the bottom wall 101 of the case 10. The front panel 14 includes, in an area overlapping the opening 101a in the case 10, a transparent portion 14a having a rectangular shape in a plan view. The bottom wall 101 of the case 10 has openings 14b, 14c, and 14d in areas corresponding to the function keys 15, the operation keys 17, and the power button 16, respectively. The function keys 15, the operation keys 17, and the power button 16 have outer dimensions in a plan view larger than the dimensions of the openings 14b, 14c, and 14d in the front panel 14. The front panel 14 is placed over the front side of the case 10 with the function keys 15, the operation keys 17, and the power button 16 attached to the mounts 101b, 101c, and 101d of the case 10. In this state, the peripheries of the function keys 15, the operation keys 17, and the power button 16 are held between the mounts 101b, 101c, and 101d of the case 10 shown in FIG. 7 and the front panel 14.

The control board 8 is accommodated in the case 10. As shown in FIGS. 4 and 5, the control board 8 includes a circuit board 80 with conductive patterns (not shown), and various electronic components mounted on the circuit board 80, including capacitors 41, a control integrated circuit 42, and a rectifier 43. This control board 8 generates a control signal corresponding to a user operation of pressing the function keys 15, the operation keys 17, or the power button 16. The control board 8 then transmits the generated control signal to the air conditioner through the signal line L. The circuit board 80 includes a plurality of (eight in FIG. 4) push switches 9, the display module 11 for displaying an operation image, and a thermistor 91 for detecting the surrounding temperature of the operation device 100. When the user presses any of the function keys 15, the operation keys 17, and the power button 16, a mount corresponding to the pressed key or button among the mounts 101b, 101c, and 101d on which the keys and buttons are attached moves toward the control board 8, and then contacts and presses the corresponding push switch 9.

The control board 8 further has two signal terminals 83 that are mounted on the circuit board 80 and are to be connected to the signal line L. The circuit board 80 has, at the periphery, four through-holes 81 for receiving screws 5 (described later) for fastening the control board 8 to the case 10. The circuit board 80 further has two openings 84a having a rectangular shape in a plan view, and cutouts 84b and 84c. The capacitors 41 are received in the openings 84a. The control integrated circuit 42 is received in the cutout 84b. The rectifier 43 is received in the cutout 84c. The control board 8 is thus thinner by the thickness of the circuit board 80 than, for example, a structure having the capacitors 41, the control integrated circuit 42, and the rectifier 43 mounted on the surface of the circuit board 80. As shown in FIG. 5, the circuit board 80 further has two protrusions 85 at the +Z-direction end of the circuit board 80 and also has two through-holes 86. The protrusions 85 and through-holes 86 are for positioning the display module 11 relative to the circuit board 80. In FIG. 5, the display module 11 is mounted on the −Y-direction side of the circuit board 80, with hooks 112 of the display module 11 engaged with the through-holes 86.

Figure 8:
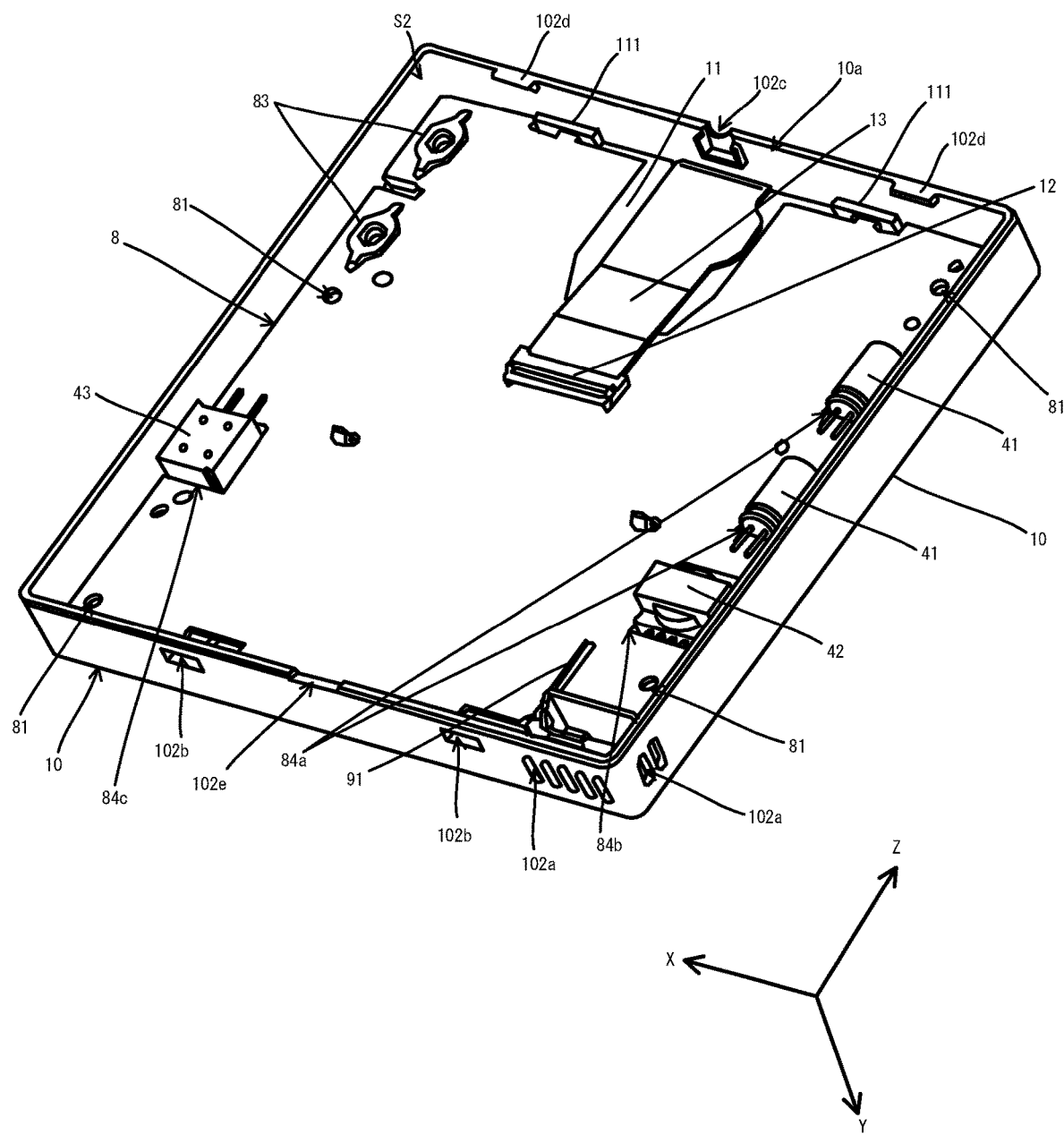
FIG. 8 is a perspective view of the control board according to Embodiment 1 placed inside the case.

The display module 11 displays, for example, the surrounding temperature of the operation device 100 and operation information for operating the air conditioner. The display module 11 is connected to the control board 8 with a connector 12 attached to the tip of a signal cable 13 that is formed from a flexible wiring board. Image information generated by the control board 8 is output to the display module 11 through the connector 12 and the signal cable 13. The display module 11 then displays an image in accordance with the image information generated by the control board 8. The display module 11 has, at the +Z direction end, two protruding tabs 111 protruding in the −Y direction. Each of the two protruding tabs 111 has a through-hole 111a in the thickness direction. The display module 11 further has the hooks 112 protruding in the −Y direction. The display module 11 is positioned to be mounted on the control board 8 by fitting the protrusions 85 of the control board 8 in the through-hole 111a in the protruding tab 111 and engaging the hook 112 with the through-hole 86 in the control board 8. Thus, the display module 11 can be relatively easily positioned when mounted on the control board 8. This facilitates the assembly operation of the operation device 100. As shown in FIG. 8, the control board 8 incorporating the display module 11 is accommodated in the case 10.

Figure 9:
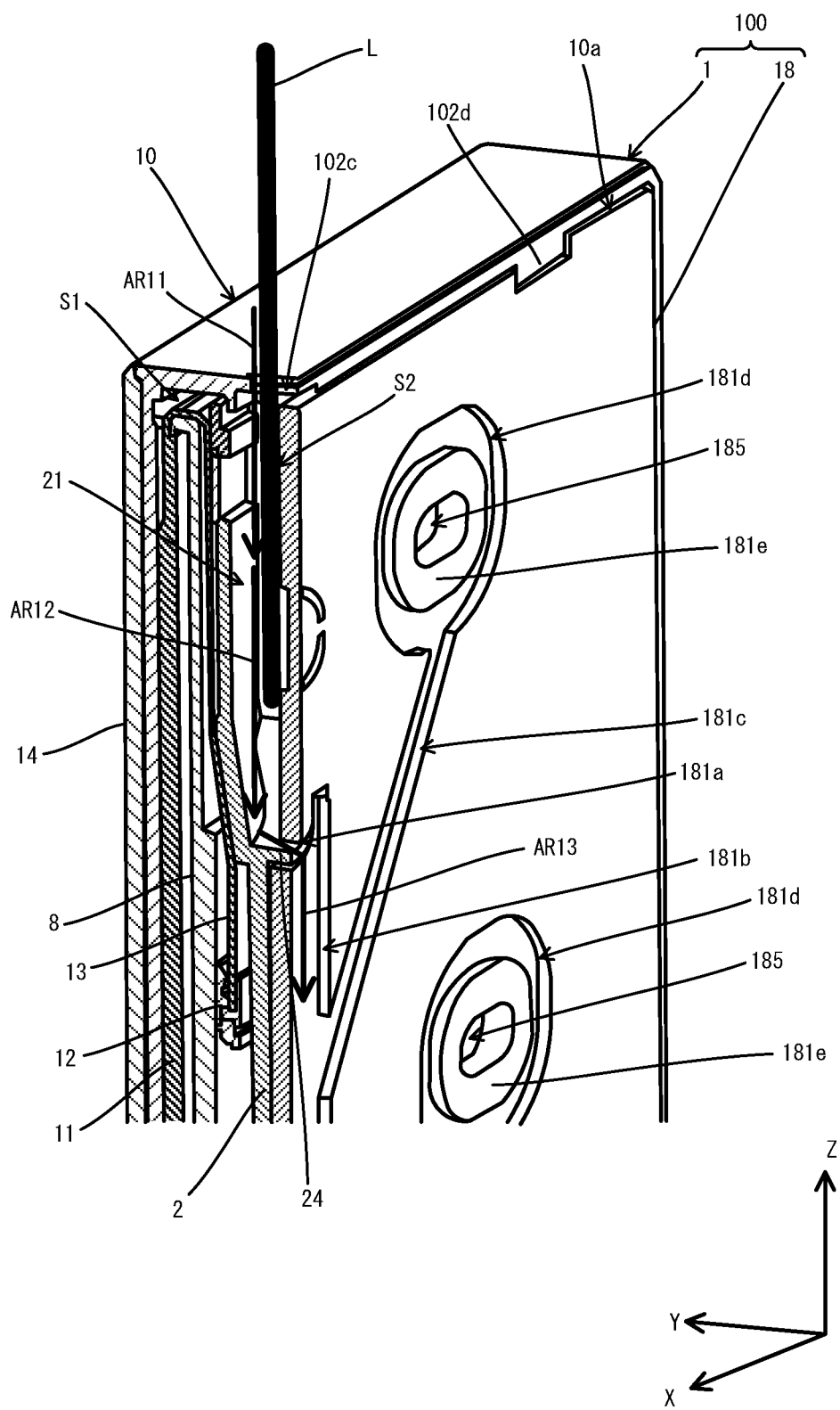
FIG. 9 is a cross-sectional view of the operation device according to Embodiment 1 taken along line A-A indicated by the arrows in FIG. 2.

As shown in FIG. 9, the protective cover 2 is placed inside the case 10 to protect the control board 8 by separating, inside the case 10, a first space S1 for the control board 8 from a second space S2 open to the outside of the case 10 through the inlet cutout 102c. As shown in FIG. 6, the protective cover 2 having a shape of a rectangular plate, has signal terminals 83 electrically connected to the conductive patterns on the circuit board 80. A dent 25 having a substantially rectangular shape in a plan view is provided in a corner of the protective cover 2 in the +X and +Z directions (in the top-left corner in FIG. 6) on the second space S2 side of the protective cover 2. Each of the two signal terminals 83 of the control board 8 at the bottom of the dent 25 has a threaded hole 83a to be screwed with a terminal screw (not shown) for electrically connecting the signal line L to the signal terminal 83. The protective cover 2 further has through-holes (not shown), through which the screws 5 are inserted, in areas overlapping the through-holes 81 in the control board 8. The screws 5 are inserted through these through-holes and the through-holes 81 in the control board 8 and screwed into threaded holes (not shown) in the case 10. This fastens the protective cover 2 and the control board 8 to the case 10.

The protective cover 2 further has signal line grooves 21 and 22 in which the signal line L is to be fitted. The signal line groove 21 has a +Z-direction end portion open to the outside of the case 10 through the inlet cutout 102c in the case 10, and a −Z-direction end portion extending toward the edge of the protective cover 2 opposite to the inlet cutout 102c, that is, extending in the −Z direction. The −Z-direction end portion of the signal line groove 21 has a convex shape curved in the −Z direction. The signal line groove 22 has an end portion communicating with the signal line groove 21 and the other end portion communicating with the dent 25. The signal line grooves 21 and 22 receive the signal line L.

The protective cover 2 further has, on the rear side of the protective cover 2, a rib 24 having a U-shape in a plan view and protruding from the outer periphery of the −Z-direction end portion of the signal line groove 21 in a direction away from the protective cover 2. The signal line groove 21 has a pair of locking tabs 23a that protrude at both sides of the signal line groove 21 in the width direction toward the center of the signal line groove 21 and lock the signal line L received in the signal line groove 21. The signal line groove 22 has two pairs of locking tabs 23b. The paired locking tabs 23b are arranged on both sides of the signal line groove 22 in the width direction toward the center of the signal line groove 22 and lock the signal line L received in the signal line groove 22.

The protective cover 2 further has, in areas overlapping the capacitors 41 mounted on the control board 8, openings 27a having a rectangular shape in a plan view. The openings 27a allow the capacitors 41 to be partially fitted. The protective cover 2 further has cutouts 27b and 27c in areas overlapping the control integrated circuit 42 and the rectifier 43 mounted on the control board 8, respectively. The cutouts 27b and 27c partially receive the control integrated circuit 42 and the rectifier 43. This allows the protective cover 2 to be placed nearer the control board 8 without interfering with the capacitors 41, the control integrated circuit 42, and the rectifier 43. The protective cover 2 further has a plurality of (five in FIG. 6) recesses 26. The recesses 26 are arranged, on the surface facing the base member 18 (described below), in areas corresponding to ribs 186.

Figure 10:
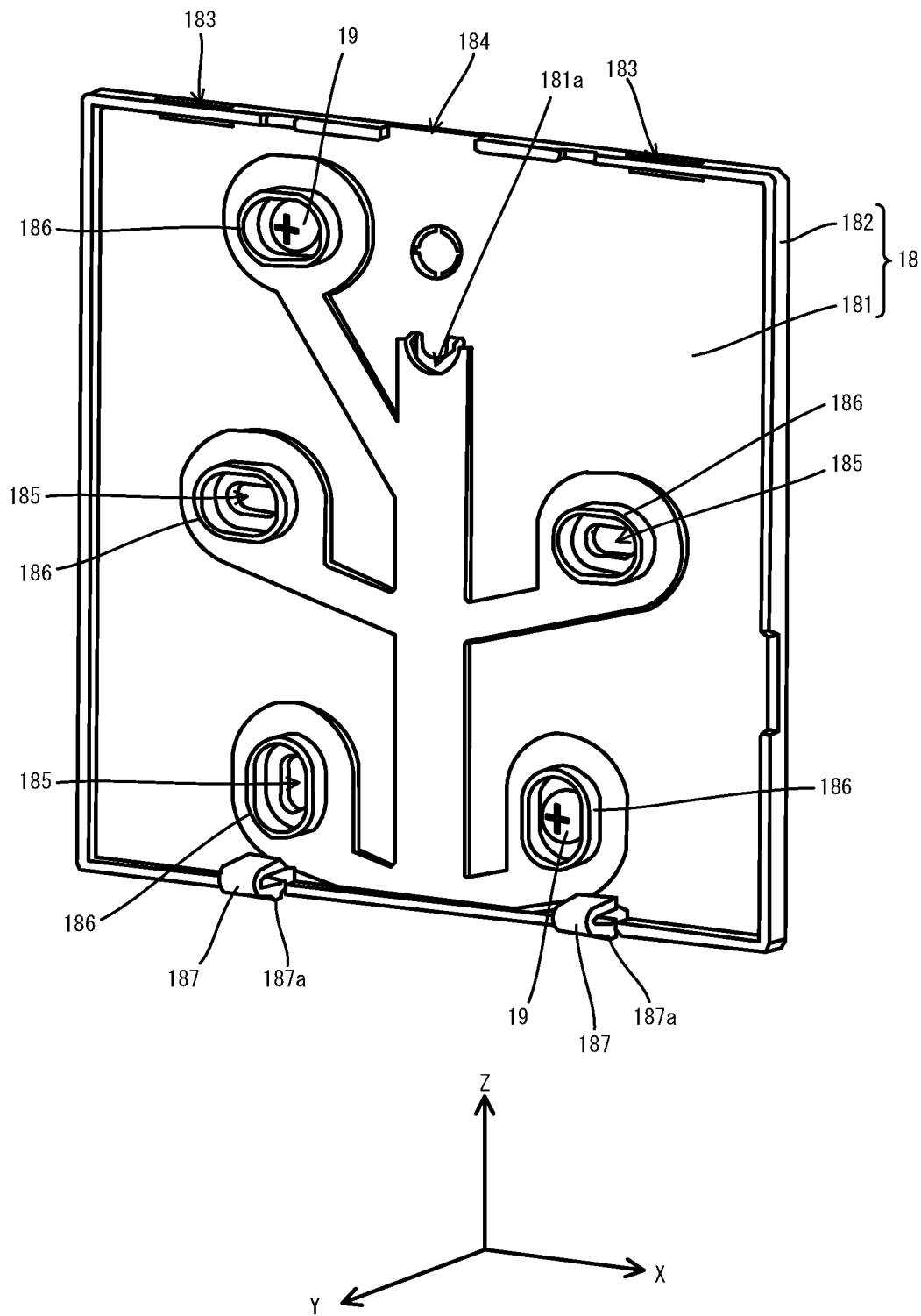
FIG. 10 is a perspective view of the base member in the operation device according to Embodiment 1.
Figure 11:
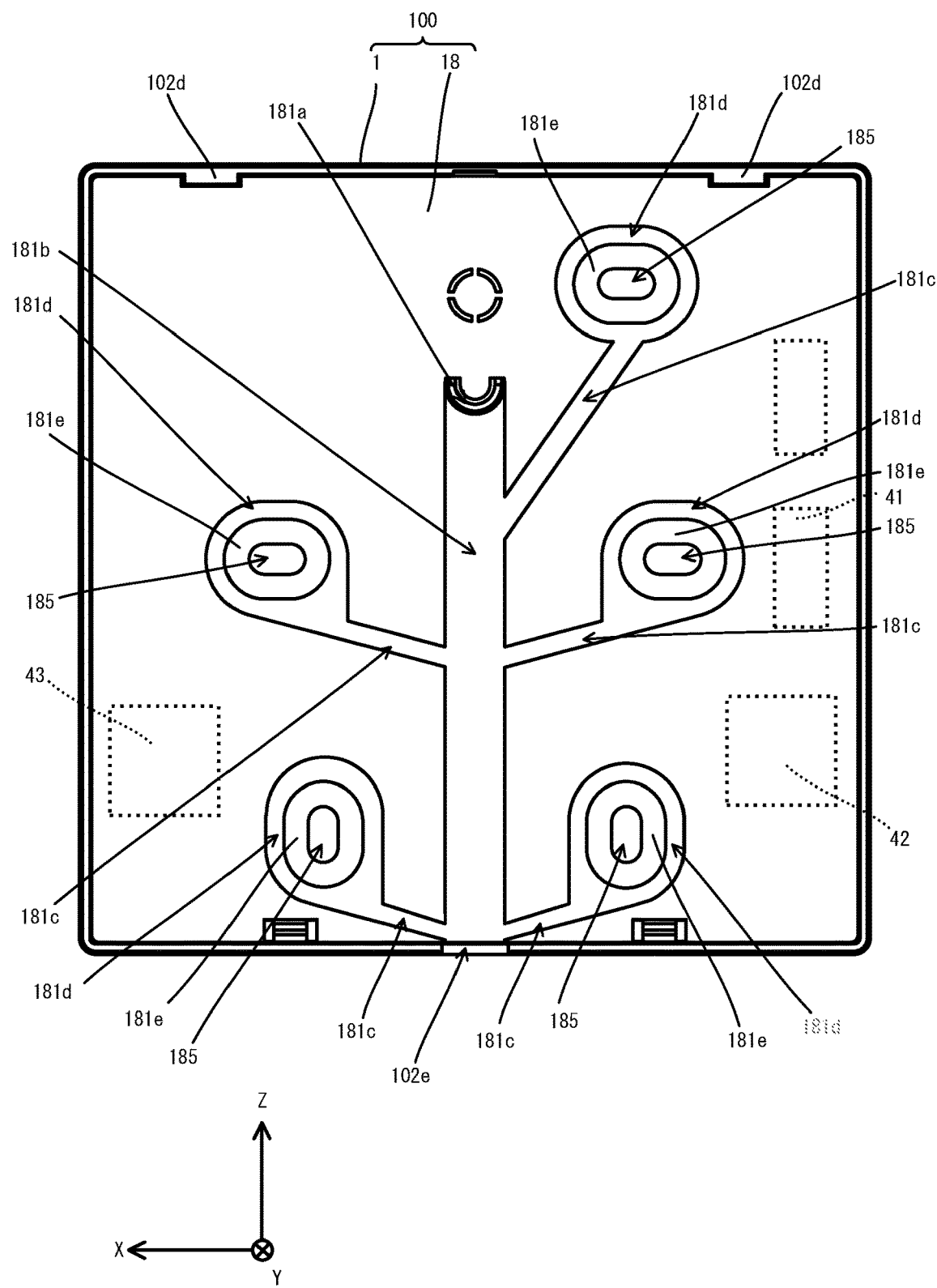
FIG. 11 is a plan view of the operation device viewed from the rear according to Embodiment 1.

As shown in FIG. 10, the base member 18 has a plurality of installation holes 185, through which screws 19 for installation to the wall W are to be inserted, and the annular ribs 186 surrounding the installation holes 185. The case 10 is fastened to the base member 18, covering the surface of the base member 18 on which the ribs are located and the periphery of the base member 18. The base member 18 includes a rectangular plate bottom wall 181, and a rectangular frame peripheral wall 182 extending from the periphery of the bottom wall 181. The base member 18 has five installation holes 185 in the bottom wall 181. Each installation hole 185 is surrounded by an annular rib 186. The base member 18 has, at its upper end, two engagement holes 183 that span the bottom wall 181 and the peripheral wall 182 to be engaged with the engagement tabs 102*d* on the case 10. The base member 18 further has, at its lower end, two hooks 187 engageable with engagement holes 102*b* in the case 10. The peripheral wall 182 has a cutout 184 in an area corresponding to the inlet cutout 102*c* in the case 10. FIG. 10 shows an example of the base member 18 attached to the wall W with the two screws 19. The installation holes 185, through which the screws 19 are to be inserted, are selected as appropriate in accordance with the installation location of the operation device 100. A device other than the operation device 100 (e.g., a switch box) may be fastened to the wall W by the base member 18. As shown in FIG. 11, the installation holes 185 are located in areas not overlapping relatively thick components such as the capacitors 41, the control integrated circuit 42, and the rectifier 43. This allows the operation device 100 to be thinner.

Figure 12:
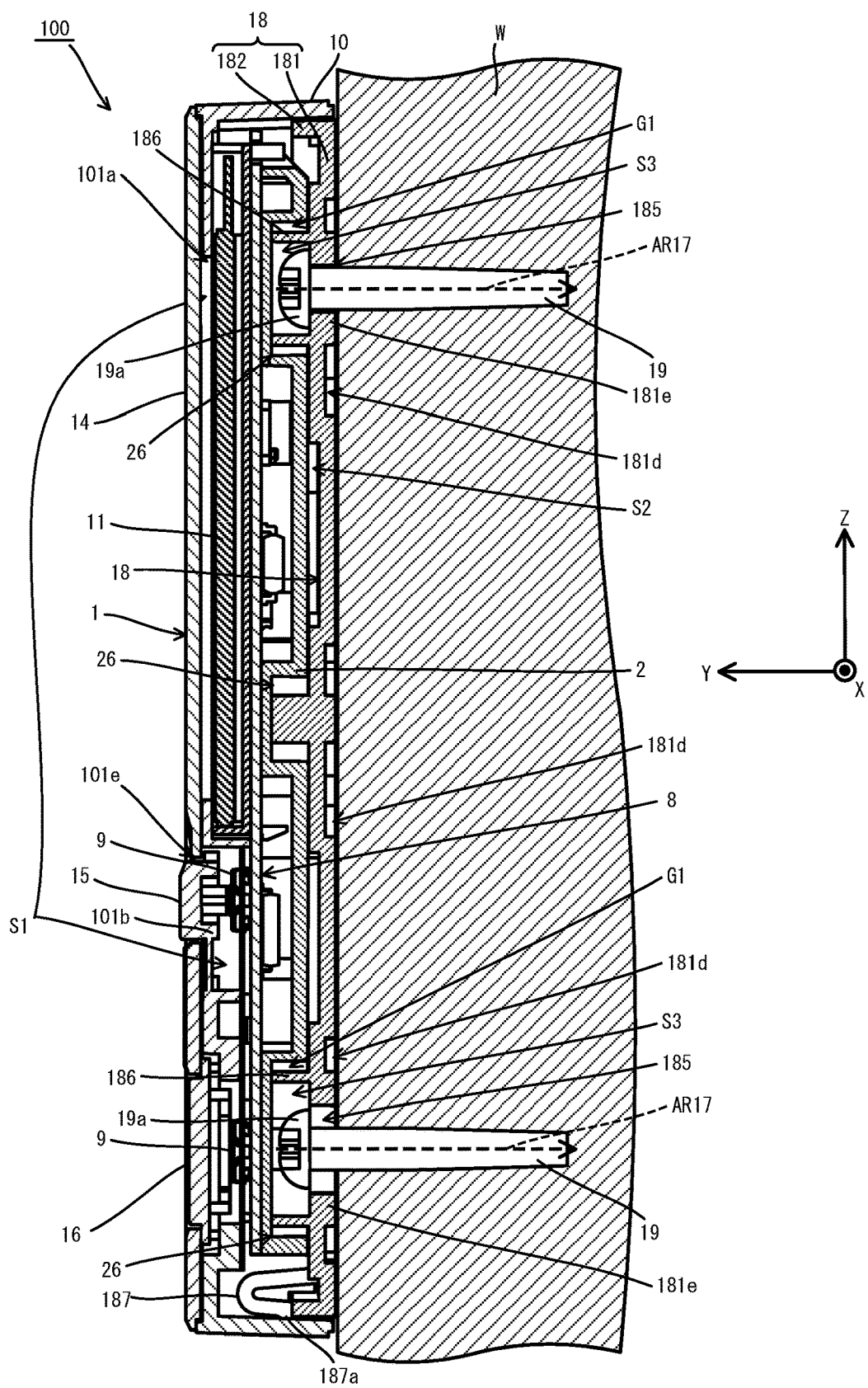
FIG. 12 is a cross-sectional view of the operation device according to Embodiment 1 installed on a wall, taken along line B-B indicated by the arrows in FIG. 2.
Figure 13:
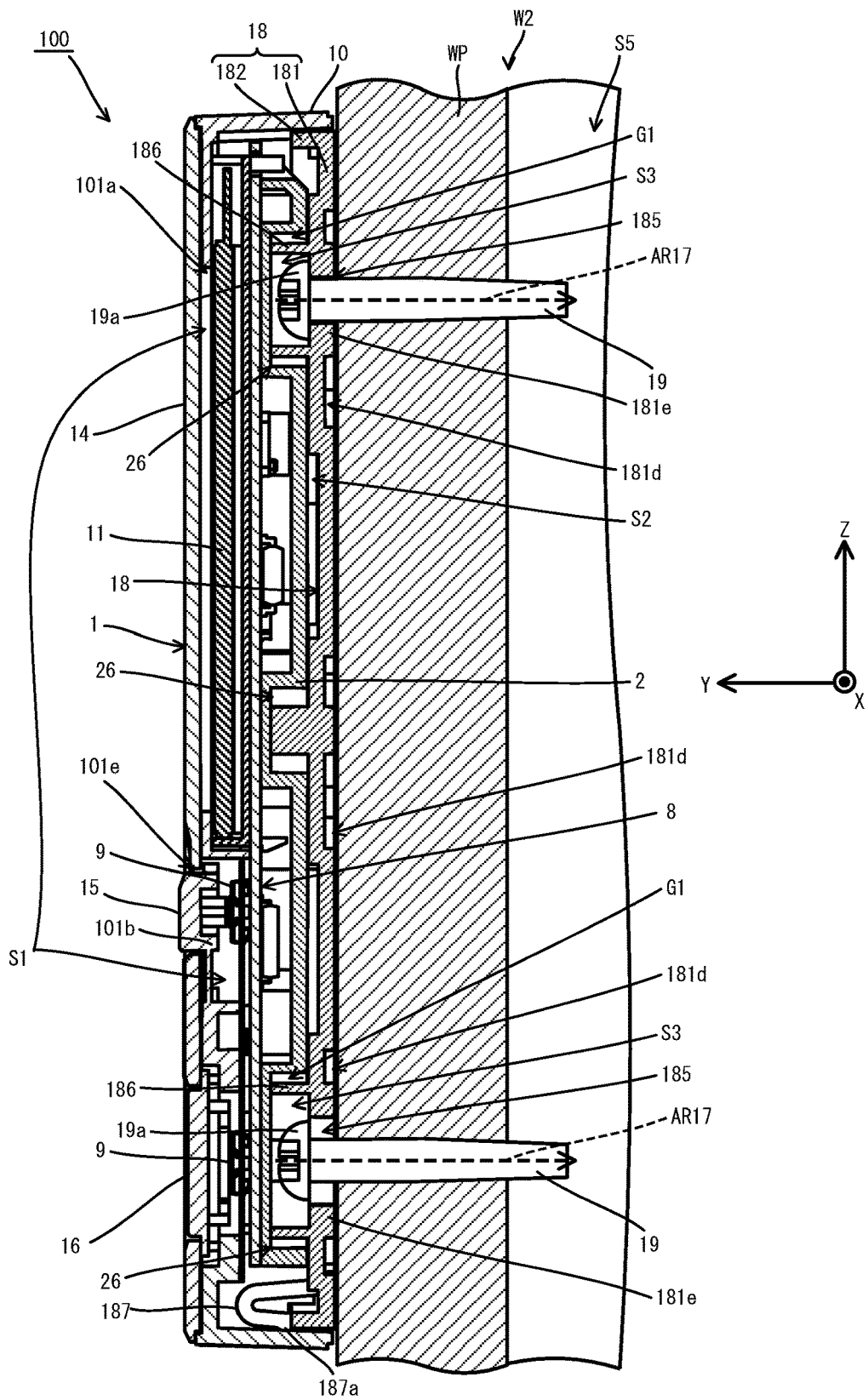
FIG. 13 is a cross-sectional view of the operation device according to Embodiment 1 installed on a hollow wall, taken along line B-B indicated by the arrows in FIG. 2.

As shown in FIG. 12, the rib 186 is fitted in the recess 26 on the protective cover 2 when the operation device body 1 is fastened to the base member 18. In the state, the leading edge of the rib 186 is in contact with the bottom of the recess 26. This separates the third space S3 defined by the rib 186 and the protective cover 2 from the second space S2 receiving the signal line L. The third space S3 contains air cooled by heat transfer through the screw 19 to the wall W (see an arrow AR17 in FIG. 12), but the separation reduces an inflow of the cooled air in the third space S3 into the second space S2, thus reducing condensation inside the operation device body 1. This further prevents water resulting from condensation on the head of the screw 19 inside the third space S3 from entering the second space S2. As shown in FIG. 13, the tip of the screw 19 longer than the thickness of a wall plate WP of a hollow wall W2 extends into a space S5 inside the wall W2 when the operation device 100 is installed on the wall W2. In the operation device 100 installed on the wall W2, cold air in the space S5 inside the wall W2 cools the air inside the third space S3. In this case as well, the reduced inflow of air cooled in the third space S3 into the second space S2 reduces condensation inside the operation device body 1.

To mount the case 10 onto the base member 18 attached to the wall W, the engagement holes 102*b* in the case 10 are engaged with the hooks 187 by rotating the case 10 about the two engagement holes 183 engaged with the engagement tabs 102*d* on the case 10. The rib 186 has a dimension in Z axis direction to provide a gap G1 in Z-axis direction between the outer surface of the rib 186 and the inner surface of the recess 26 when the rib 186 is fitted in the recess 26. The gap G1 may have a width of, for example, about 1 mm. This allows the rib 186 to be smoothly fitted in the recess 26 when the case 10 is mounted on the base member 18. This gap G1 can also accommodate a certain level of dimensional errors in manufacturing of the rib 186 and the recess 26 and a certain level of variations in mounting of the case 10 onto the base member 18.

As shown in FIGS. 2, 9, and 10, the base member 18 further has a drain hole 181*a* having a U-shape in a plan view. The drain hole 181*a* is a through-hole for draining water generated inside the signal line groove 21 on the protective cover 2 out of the case 10. As shown in FIG. 2, the drain hole 181*a* is in a portion covering the opening 10*a* of the case 10. The leading edge of the rib 24 on the protective cover 2 is fitted in the drain hole 181*a*.

The base member 18 further has dents 181*d* surrounding the installation holes 185, a first groove 181*b*, and second grooves 181*c* on a surface opposite to the control board 8 (in the −Y direction). An annular seat 181*e* is located between the installation hole 185 and the dent 181*d*. The first groove 181*b* extends from the outer periphery of the drain hole 181*a* in the −Z direction (first direction) and has a −Z-direction edge located at the −Z-direction edge of the base member 18. The second groove 181*c* has an end communicating with the first groove 181*b* and the other end communicating with the dent 181*d*. The other end of the second groove 181*c* is located farther in the +Z direction (second direction) than the end of the second groove 181*c* when the base member 18 is installed on the wall W with the −Z direction of the base member 18 being vertically downward, as shown in FIG. 3. In other words, the second groove 181*c* slopes downward (in the −Z direction) along its central axis J41, J42, J43, J44, or J45 toward the first groove 181*b*. Angles $\varphi1$, $\varphi2$, $\varphi3$, $\varphi4$, and $\varphi5$ between a central axis J3 of the first groove 181*b* and the central axes J41, J42, J43, J44, and J45 of the second grooves 181*c* are all less than 90°.

The dents 181*d*, the first groove 181*b*, and the second grooves 181*c* are formed by pressing of a base material for the base member 18. Thus, each of the dents 181*d*, the first groove 181*b*, and the second grooves 181*c* has the bottom as thick as the bottom wall 181 excluding the dents 181*d*, the first groove 181*b*, and the second grooves 181*c*. The first groove 181*b* and the second grooves 181*c* may have any width. The first groove 181*b* and the second grooves 181*c* having smaller widths increase the area in the bottom wall 181 excluding the first groove 181*b* and the second grooves 181*c*, thus increasing the area of contact between the base member 18 and the wall W. This structure has a larger heat path for transferring heat generated in the operation device body 1 through the base member 18 to the wall W, thus improving the heat dissipation characteristics.

Figure 14:
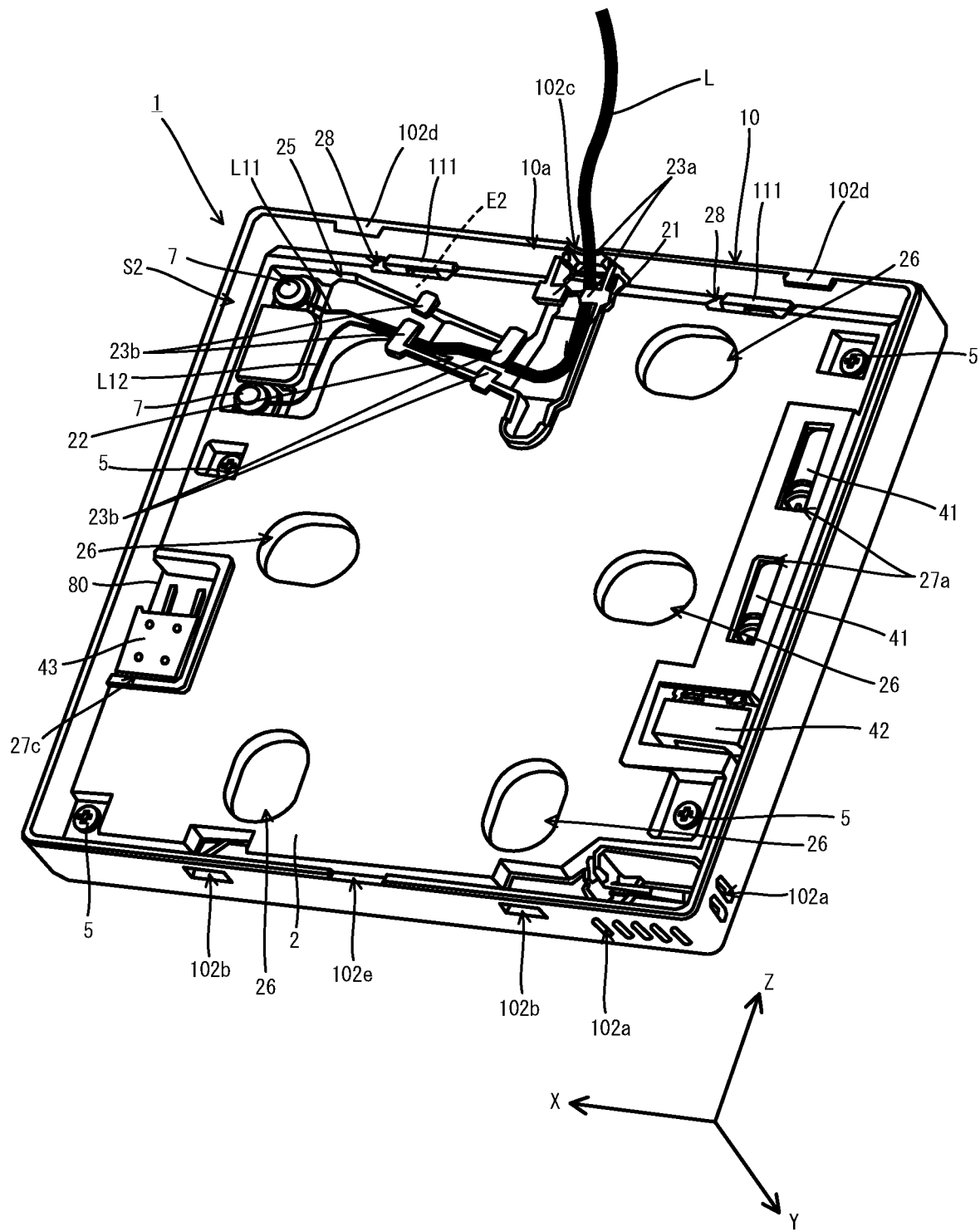
FIG. 14 is a perspective view of the operation device body according to Embodiment 1, with a signal line fixed to the operation device body.

Next, a procedure for assembling the operation device 100 according to the present embodiment is described. As shown in FIG. 14, the signal line L is guided into the case 10 through the inlet cutout 102*c* in the case 10. The signal line L is then received in the signal line grooves 21 and 22. More specifically, the signal line L is placed inside the signal line groove 21 by forcing the signal line L between a pair of locking tabs 23*a* facing each other in the width direction of the signal line groove 21. Also, the signal line L is placed inside the signal line groove 22 by forcing the signal line L between two pairs of the locking tabs 23*b* facing each other in the width direction of the signal line groove 22. Branch lines L11 and L12 at the tip of the signal line L are then each connected to the signal terminal 83 with a terminal screw 7 screwed into the threaded hole 83*a* in the signal terminal 83.

Figure 15:
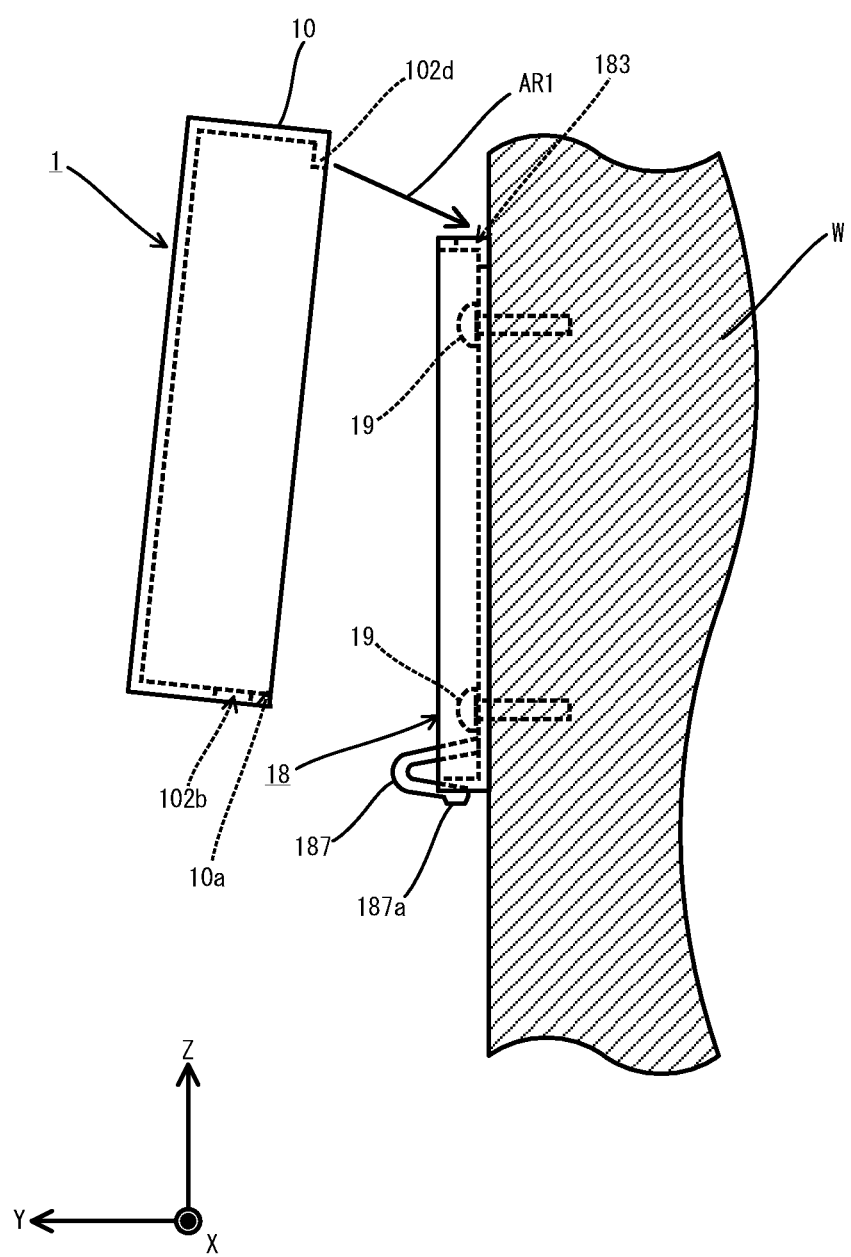
FIG. 15 is a schematic diagram describing the procedure for installing the operation device according to Embodiment 1.
Figure 16:
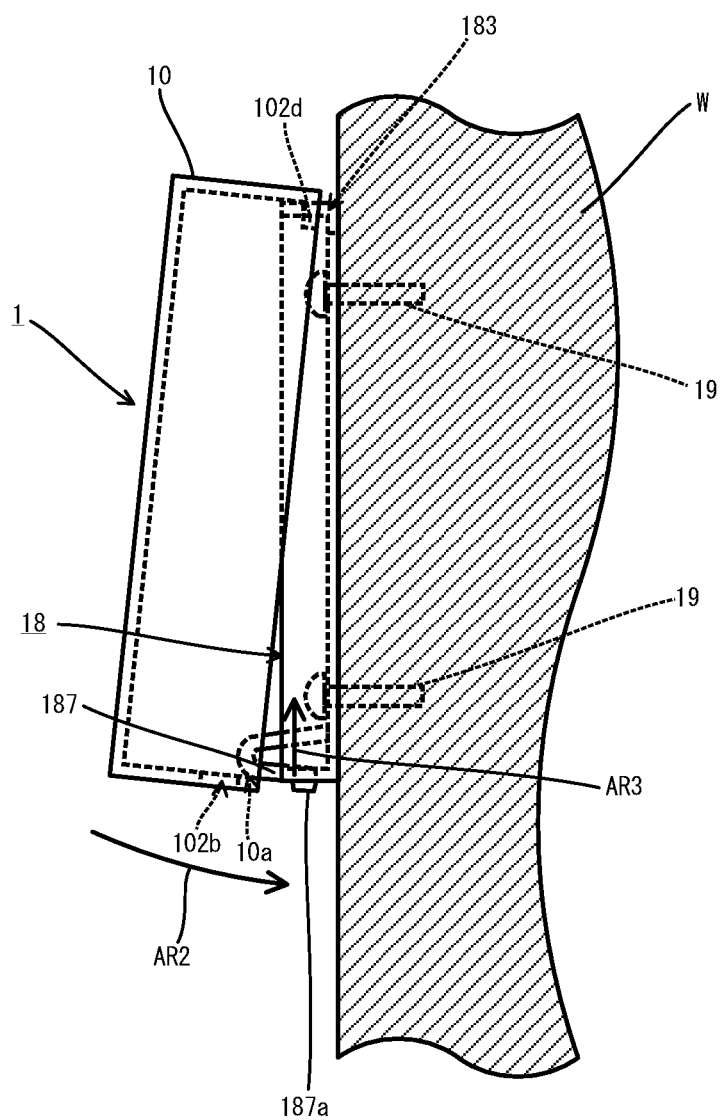
FIG. 16 is a schematic diagram describing the procedure for installing the operation device according to Embodiment 1.
Figure 17:
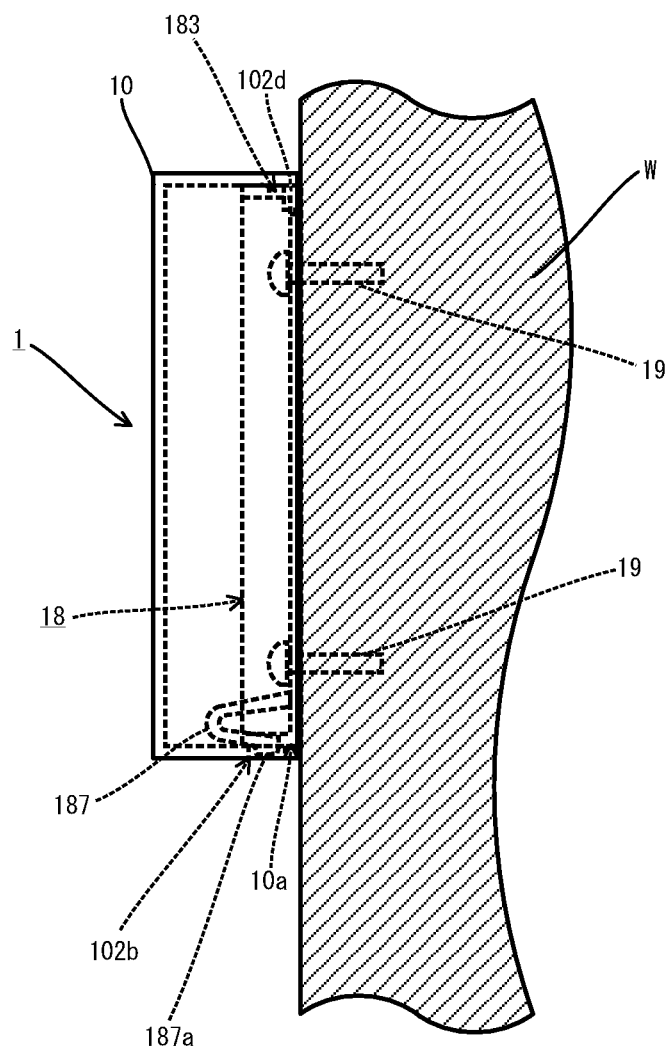
FIG. 17 is a schematic diagram describing the procedure for installing the operation device according to Embodiment 1.

As shown in FIG. 15, the base member 18 is then attached to the wall W with the screws 19. As indicated by an arrow AR1 in FIG. 15, the engagement tabs 102*d* on the case 10 are then engaged with the engagement holes 183 in the base member 18. The operation device body 1 is hung from the base member 18 as shown in FIG. 16. As indicated by an arrow AR2 in FIG. 16, the case 10 is then rotated about the engagement tabs 102*d* engaged with the engagement holes 183 in the base member 18 until the lower peripheral wall 102 of the case 10 is partially made in contact with the hooks 187 on the base member 18. The case 10 is then further rotated in the direction of the arrow AR2 to bend tips 187*a* of the hooks 187 on the base member 18 upward as indicated by an arrow AR3. As shown in FIG. 17, the engagement holes 102*b* in the case 10 are then engaged with the tips 187*a* of the hooks 187 on the base member 18. This fastens the operation device body 1 to the base member 18. Similarly as in the description with reference to FIG. 13, the tip of the screw 19 longer than the thickness of the wall plate WP of the wall W2 extends into the space S5 inside the wall W2.

Next, a drainage path through which water entering the case 10 from outside along the signal line L flows to be drained out of the case 10 in the operation device 100 according to the present embodiment is described. Water resulting from condensation on the surface of the signal line L travels down the signal line L as indicated by an arrow AR11 in FIG. 9 and then enters the second space S2 defined by the signal line groove 21 on the protective cover 2 and the base member 18 inside the case 10. As indicated by an arrow AR12, the water entering the second space S2 flows along the signal line groove 21 downward (in the −Z direction) to the lower end of the signal line groove 21, at which the rib 24 is located. As indicated by an arrow AR13, the water reaching the lower end of the signal line groove 21 flows through the drain hole 181a in the base member 18 to the first groove 181b outside the base member 18 along the rib 24. As indicated by an arrow AR14 in FIG. 2, the water reaching the first groove 181b flows along the first groove 181b to the lower end of the base member 18. As indicated by an arrow AR15, the water reaching the lower end of the base member 18 is then drained out of the case 10 through a drain cutout 102e in the case 10.

Next, a drainage path through which water entering the dent 181d on the base member 18 flows to be drained out of the case 10 in the operation device 100 according to the present embodiment is described. Water resulting from, for example, condensation on the screw 19 may flow to the dent 181d through a gap occurring between the seat 181e on the base member 18 and the wall W. As indicated by an arrow AR16 in FIG. 2, the water reaching the dent 181d flows along the second groove 181c to the first groove 181b. As indicated by an arrow AR14 in FIG. 2, the water reaching the first groove 181b flows along the first groove 181b downward. The water reaching the lower end of the first groove 181b is then drained out of the case 10 through the drain cutout 102e in the case 10.

As described above, the protective cover 2 of the operation device 100 according to the present embodiment protects the control board 8 by separating, inside the case 10, the space defined by the base member 18 and the case 10 into the first space S1 for the control board 8 and the second space S2 exposed to the base member 18. The base member 18 has the installation holes 185 through which the screws 19 for installing the case 10 on the wall W are inserted, and the annular ribs 186 surrounding the installation holes 185. The protective cover 2 has, on the surface facing the base member 18, the recesses 26 in areas corresponding to the ribs 186. The rib 186 is fitted in the recess 26 with its leading edge in contact with the bottom of the recess 26. The screw 19 inserted in the installation hole 185 has its head 19a placed inside the third space S3 defined by the rib 186 and the protective cover 2. The third space S3 contains air cooled by heat transfer through the screw 19 with the base member 18 attached to the wall W with the screw 19, but such arrangement reduces an inflow of the cooled air in the third space S3 into the second space S2, thus reducing condensation inside the operation device body 1. This further prevents water resulting from condensation on the head 19a of the screw 19 inside the third space S3 from entering the second space S2. In other words, water resulting from condensation inside the operation device body 1 and condensation on the head 19a of the screw 19 is less likely to enter the second space S2, thus reducing malfunctioning of the operation device 100. This also reduces an inflow of air entering the third space S3 through the installation hole 185 from outside the operation device 100 into the second space S2, thus reducing condensation inside the operation device body 1.

The base member 18 in the present embodiment further has the dents 181d surrounding the installation holes 185, the first groove 181b, and the second grooves 181c. The screw 19 for installing the base member 18 on the wall W is inserted through the installation hole 185. The first groove 181b extends in the −Z direction. The second groove 181c has the end near the first groove 181b communicating with the first groove 181b and the other end communicating with the dent 181d. The other end of the second groove 181c is located farther in the +Z direction than the end of the second groove 181c. Thus, water drained to the dent 181d, under force of gravity, flows out to the first groove 181b along the second groove 181c and then through the first groove 181b to be drained down from the operation device 100. This reduces degradation of the base member 18 due to water retained between the base member 18 and the wall W.

The case 10 has the opening 10a covered by the base member 18. The base member 18 has the drain hole 181a located in a portion covering the opening 10a of the case 10. The protective cover 2 includes the rib 24 protruding from the outer periphery of the end of the signal line groove 21 in the −Z direction and having the leading edge fitted in the drain hole 181a in the base member 18. The water entering the signal line groove 21 can be drained in a reliable manner along the rib 24 into the first groove 181b on the base member 18. The −Z-direction end of the signal line groove 21 in the present embodiment is curved to have a convex shape in the −Z direction. The rib 24 is U-shaped in a plan view and extends along the outer periphery of the −Z direction end of the signal line groove 21. This allows water entering the signal line groove 21 to be smoothly drained along the rib 24 into the first groove 181b on the base member 18.

The circuit board 80 according to the present embodiment has the two openings 84a that are rectangular in a plan view, and the cutouts 84b and 84c. The capacitors 41 are received in the openings 84a. The control integrated circuit 42 is received in the cutout 84b. The rectifier 43 is received in the cutout 84c. The control board 8 is thus thinner by the thickness of the circuit board 80 than, for example, a structure having the capacitors 41, the control integrated circuit 42, and the rectifier 43 mounted on the surface of the circuit board 80. The protective cover 2 has the openings 27a and the cutouts 27b and 27c in areas corresponding to the openings 84a and the cutouts 84b and 84c in the circuit board 80. The capacitors 41 are partially fitted in the openings 27a. Likewise, the control integrated circuit 42 and the rectifier 43 are partially fitted in the cutouts 27b and 27c. This allows the protective cover 2 to be placed near the control board 8 without interfering with the capacitors 41, the control integrated circuit 42, and the rectifier 43. Such arrangement can reduce the thickness of the case 10, thus allowing the operation device 100 to be thinner.

Embodiment 2

An operation device according to Embodiment 2 differs from the operation device 100 according to Embodiment 1 in that a base member has communication holes communicating with a third space defined by a rib on the base member and a recess on the protective cover to allow water retained in the third space to be drained out of the operation device through the communication hole.

Figure 18:
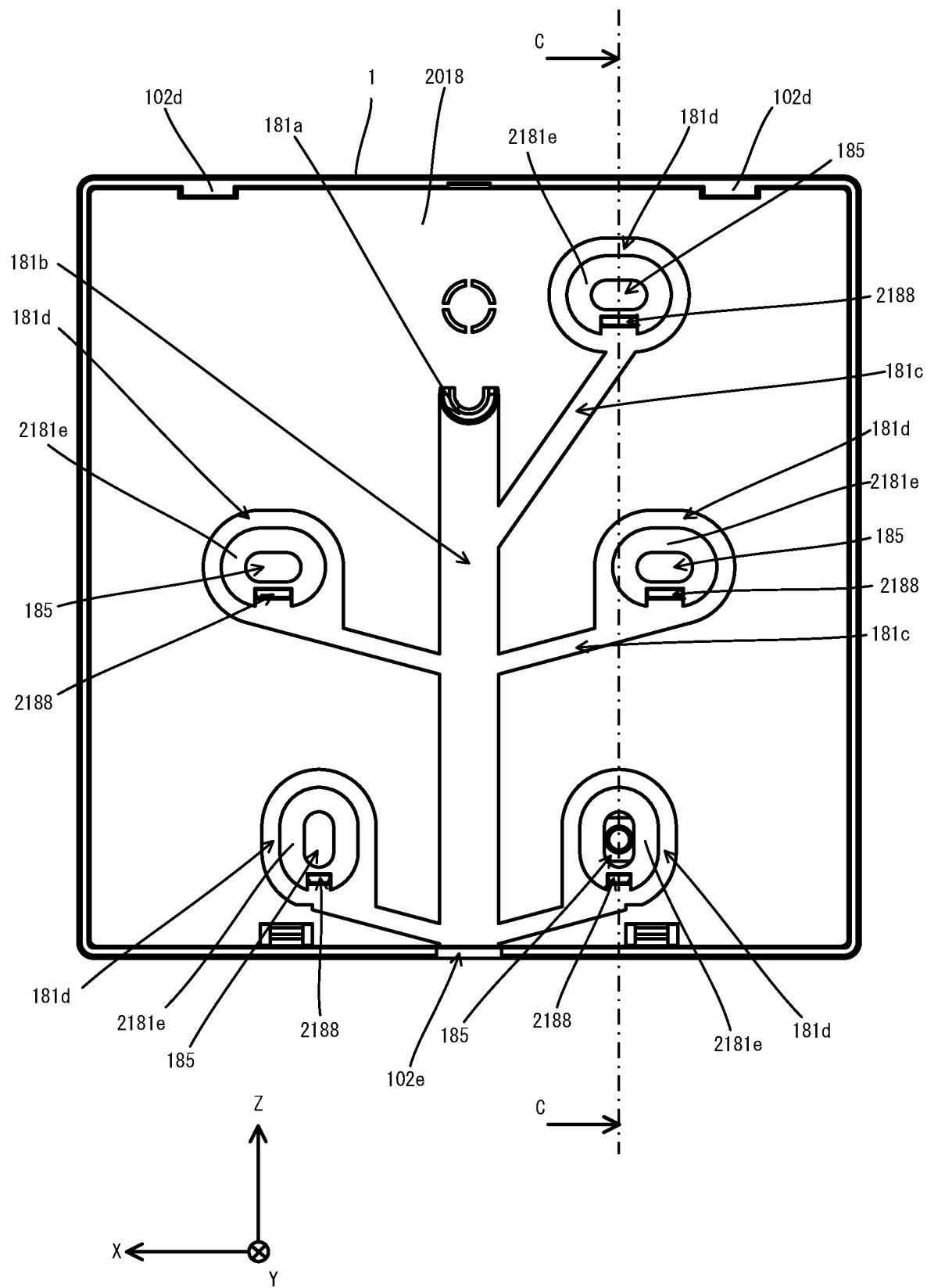
FIG. 18 is a plan view of an operation device viewed from the rear according to Embodiment 2.

As shown in FIG. 18, an operation device 200 according to the present embodiment includes an operation device body 1 and a base member 2018. In FIG. 18, the same components as in Embodiment 1 are given the same reference numerals as in FIGS. 2 and 11. The base member 2018 has a plurality of installation holes 185 through which screws 19 are to be inserted, like the base member 18 described in Embodiment 1. The case 10 is fastened on the surface of the base member 2018 on which ribs 2186 are located as shown in FIG. 18. The base member 2018 includes a rectangular plate bottom wall 2181, and the peripheral wall 182 extending from the periphery of the bottom wall 2181, like the base member 18 described in Embodiment 1. The base member 2018 further has the dents 181d surrounding the installation holes 185 in a surface in the −Y direction, the first groove 181b, and the second groove 181c. An annular seat 2181e is located between the installation hole 185 and the dent 181d.

Figure 19:
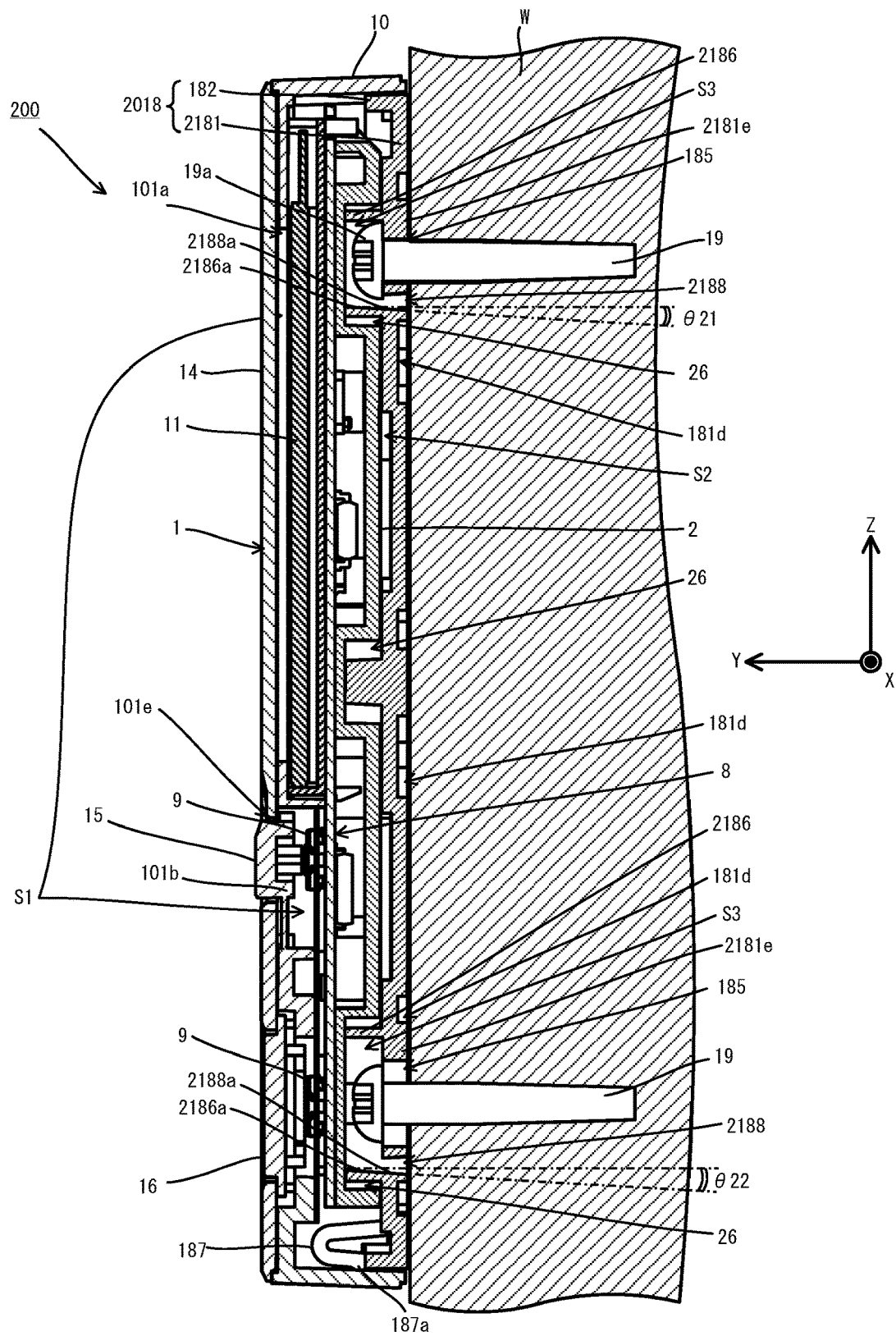
FIG. 19 is a cross-sectional view of the operation device according to Embodiment 2 installed on a wall, taken along line C-C indicated by the arrows in FIG. 18.

The ribs 2186 are located to face and surround the installation holes 185 as shown in FIG. 19. The rib 2186 is fitted in the recess 26 on the protective cover 2 when the operation device body 1 is fastened to the base member 2018. The leading edge of the rib 2186 is in contact with the bottom of the recess 26. This separates the third space S3 defined by the rib 2186 and the bottom of the recess 26, from the second space S2 receiving the signal line L. The screw 19 inserted in the installation hole 185 has its head 19a placed in the third space S3. The base member 2018 further has communication holes 2188 that are elongated and rectangular in a plan view. The communication holes 2188 are located farther in the −Z direction than the installation hole 185 and communicate with the third space S3 in the −Y direction of the base member 2018. This allows water resulting from condensation on the head 19a of the screw 19 in the third space S3 to be drained out of the operation device 200 through the communication hole 2188. The shape of the communication hole 2188 is not limited to rectangular in a plan view. The communication hole 2188 may be in other shapes such as circular, elliptical, and square.

An inner wall 2186a of the rib 2186 in the −Z direction (vertically downward) and an inner wall 2188a of the communication hole 2188 in the −Z direction slope in the −Z direction (vertically downward) in the direction opposite to the control board 8 (in the −Y direction). The inner walls 2186a and 2188a have slope angles θ21 and θ22 of, for example, 1 to 5°. This reduces an inflow of water resulting from condensation on the head 19a of the screw 19 in the third space S3 to reach the control board 8. This also allows water generated in the third space S3 to be easily drained along the inner wall 2186a of the rib 2186 and the inner wall 2188a of the communication hole 2188 out of the operation device 200, thus preventing water from being retained in the third space S3.

As described above, the base member 2018 in the operation device 200 according to the present embodiment has the communication holes 2188 located farther in the −Z direction (vertically downward) than the installation hole 185 when the base member 2018 is installed on the wall W. Each communication hole 2188 communicates with the third space S3 from the surface of the base member opposite to the control board 8 (in the −Y direction). This allows water resulting from condensation on the head 19a of the screw 19 in the third space S3 to be drained out of the operation device 200 through the communication hole 2188, and reduces water retained in the third space S3 entering the second space S2 or the first space S1. This reduces malfunctioning of the operation device 200 due to such water entry.

The inner wall 2186a of the rib 2186 according to the present embodiment in the −Z direction and the inner wall 2188a of the communication hole 2188 in the −Z direction slope in the −Z direction (vertically downward) in the direction opposite to the control board 8 (in the −Y direction). This allows water resulting from condensation on the head 19a of the screw 19 in the third space S3 to be smoothly drained out of the operation device 200, thus reducing water being retained in the third space S3.

Embodiment 3

An operation device according to Embodiment 3 differs from the operation device according to the first and second embodiments in that the operation device does not include a protective cover. The operation device according to the present embodiment includes lids fitted on the leading edge of the rib on the base member, instead of the protective cover to prevent water from entering the first space accommodating the control board inside the case.

Figure 20:
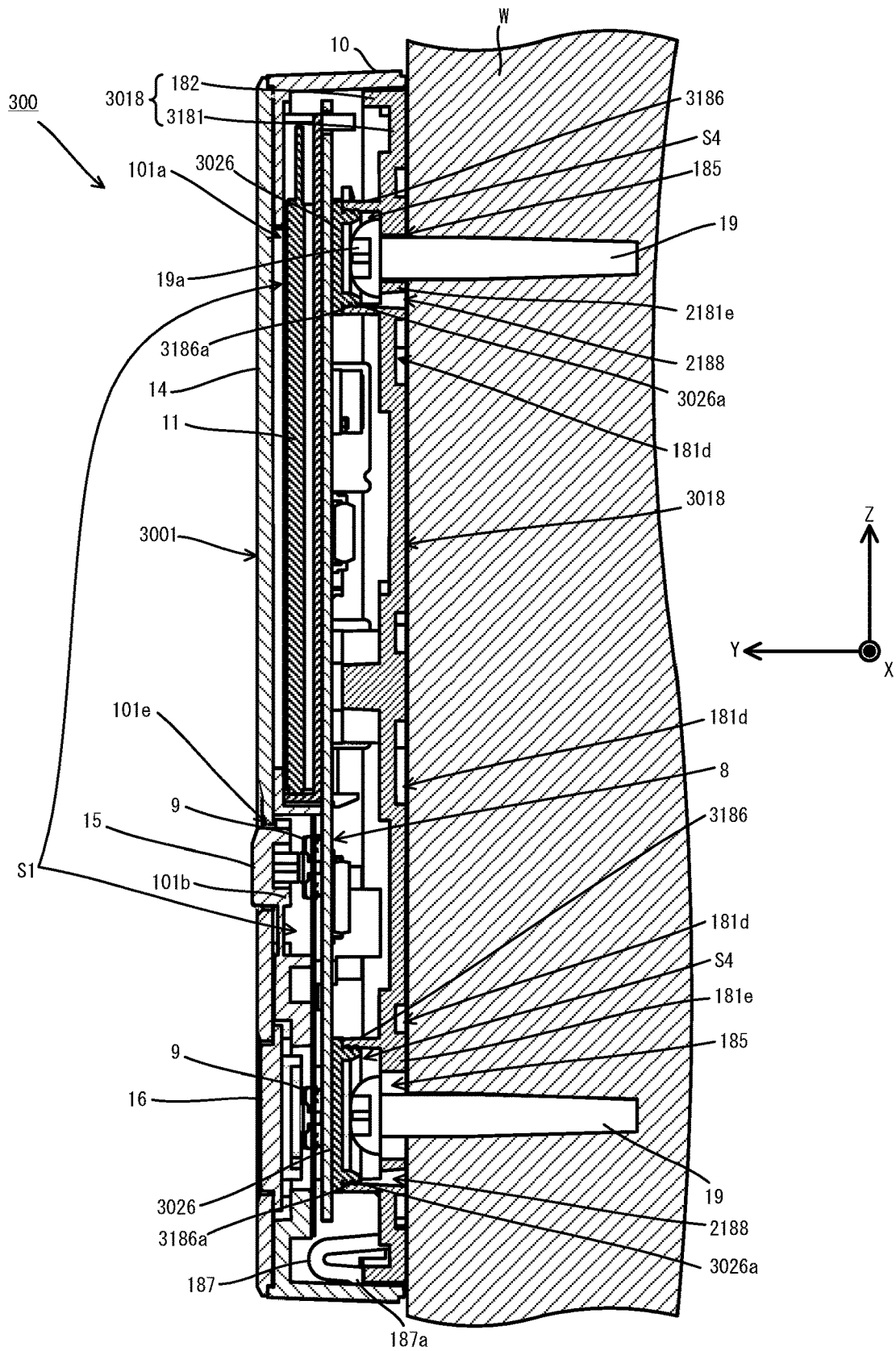
FIG. 20 is a cross-sectional view of an operation device according to Embodiment 3 installed on a wall.
Figure 21:
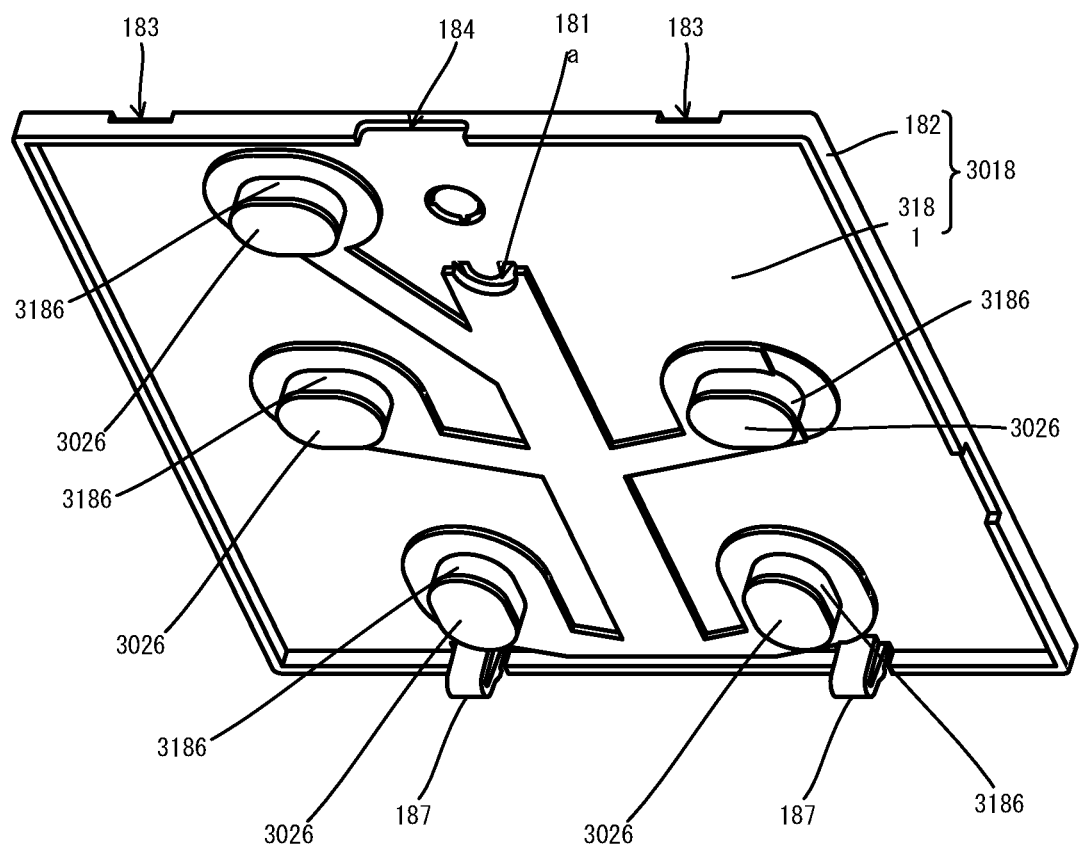
FIG. 21 is a perspective view of a base member in the operation device according to Embodiment 3.
Figure 21:
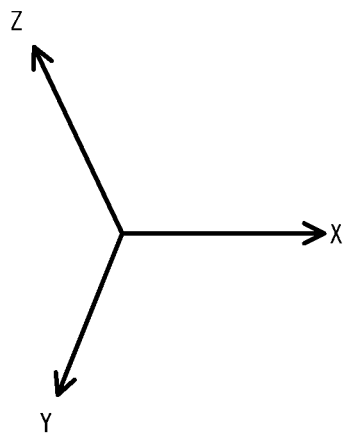

As shown in FIG. 20, an operation device 300 according to the present embodiment includes an operation device body 3001 and a base member 3018. In FIG. 20, the same components as in the first and second embodiments are given the same reference numerals as in FIGS. 12 and 19. The operation device body 3001 is the same as the operation device body 1 according to Embodiment 1 excluding the protective cover 2. The base member 3018 includes a rectangular plate bottom wall 3181, the peripheral wall 182 extending from the periphery of the bottom wall 3181, and a plurality of installation holes 185 in the bottom wall 3181, like the base member 18 described in Embodiment 1. The installation hole 185 is surrounded by an annular rib 3186, as in the first and second embodiments. The leading edge of the rib 3186 is closed by a lid 3026 as shown in FIG. 21. The lid 3026 is formed from, for example, a thermosetting resin elastomer, such as silicone rubber and fluorine rubber, vulcanized rubber, such as ethylene propylene diene rubber, or other resin materials different from materials for the base member 3018. The lid 3026 includes ridges 3026a with a corrugated profile. When the lid 3026 is press-fit onto the leading edge of the rib 3186, a fourth space S4 defined by the rib 3186 and the lid 3026 is separated from the first space S1 accommodating the control board 8. The lid 3026 formed from an elastomer, such as silicone rubber and fluorine rubber, may particularly improve the airtightness of the fourth space S4. The screw 19 inserted in the installation hole 185 has its head 19a placed in the fourth space S4. The lid may have other shapes. Although the lid has the ridge 3026a to be positioned inside the rib 3186, the lid can have any structure as long as such a space can be formed, for example, with a corrugated ridge positioned outside the rib 3186. The base member 3018 further has communication holes 2188 that are located farther in the −Z direction than the installation hole 185 and communicate with the fourth space S4 in the −Y direction of the base member 3018, like the base member 2018 according to Embodiment 2. This allows water resulting from condensation on the head 19a of the screw 19 in the fourth space S4 to be drained out of the operation device 300 through the communication hole 2188.

Next, a procedure for installing the operation device 300 according to the present embodiment on the wall W is described. The screw 19 is inserted into the installation hole 185 in the base member 3018, and the base member 3018 is installed on the wall W with the screw 19. The lid 3026 is then press-fit onto the leading edge of the rib 3186 on the base member 3018 installed on the wall W. The operation device body 3001 is then mounted on the base member 3018 in the same manner as for mounting the operation device body 1 according to Embodiment 1 on the base member 3018.

As described above, the lid 3026 in the operation device 300 according to the present embodiment is press-fit onto the leading edge of the rib 3186 to separate the fourth space S4 defined by the rib 3186 and the lid 3026 from the first space S1 accommodating the control board 8. This prevents water resulting from condensation on the head 19a of the screw 19 from entering the first space S1 accommodating the control board 8. This structure eliminates the protective cover 2, thus allowing the operation device 300 to be thinner.

Modifications

Although the embodiments of the present disclosure have been described above, the present disclosure is not limited to the above embodiments. For example, the protective cover may have a recess with at least a bottom formed from an elastic material. This protective cover allows elastic deformation in a part of the recess bottom in contact with the leading edge of the rib on the base member to improve sealing between the bottom of the recess and the leading edge of the rib.

Figure 22:
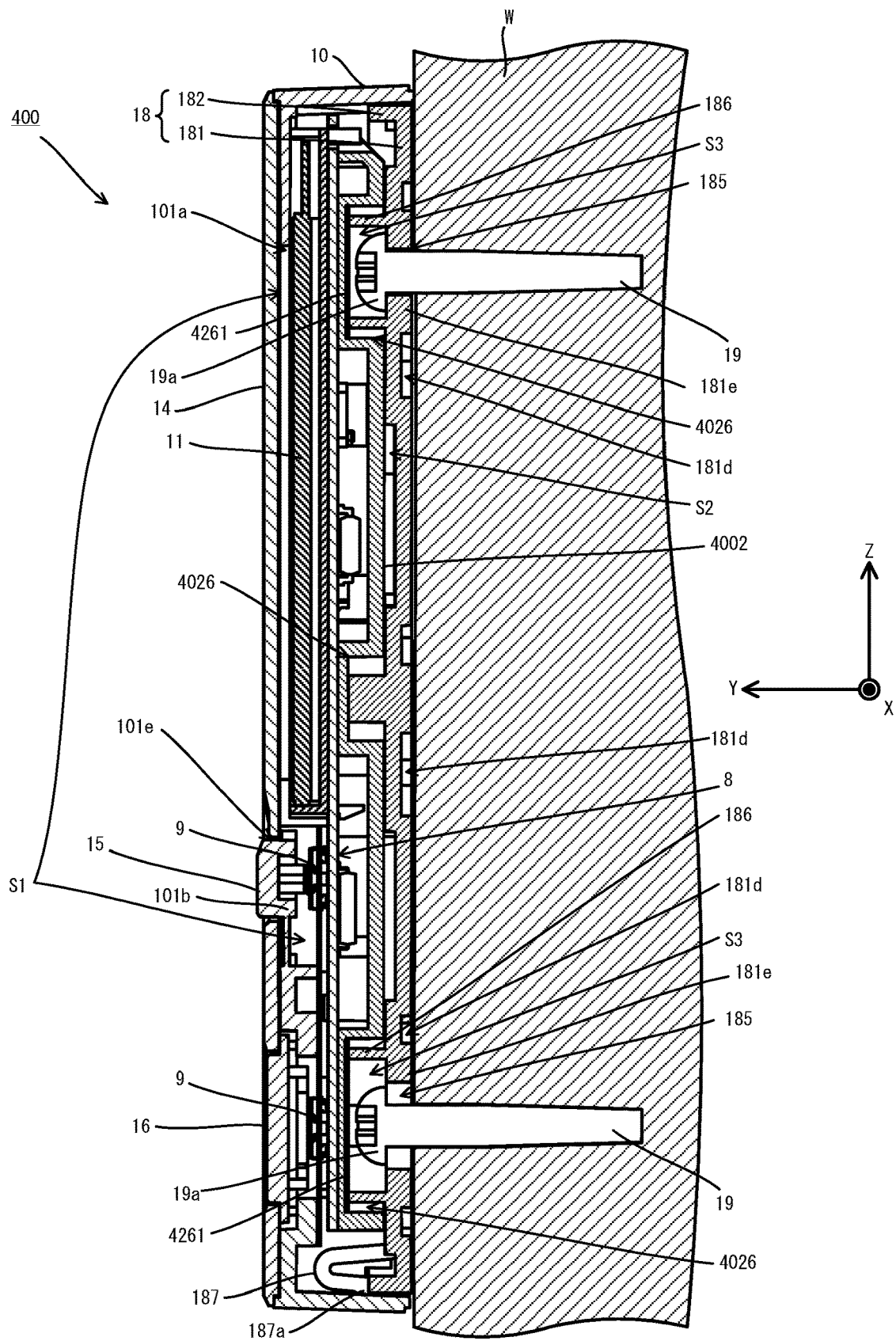
FIG. 22 is a cross-sectional view of an operation device according to a modification installed on a wall.

In an operation device 400 according to the present modification shown in FIG. 22, a protective cover 4002 has a recess 4026 having a bottom 4261 formed from an elastic material. The elastic material may be, for example, a thermosetting resin elastomer, such as silicone rubber and fluorine rubber, and vulcanized rubber, such as ethylene propylene diene rubber. The bottom 4261 is formed integrally with the other part of the protective cover 4002. The bottom 4261 may be formed separately from the other part of the protective cover 4002. The bottom 4261 may be fitted in the recess 4026 on the protective cover 4002 prior to shipment of the protective cover 4002. This may reduce the work of an installation worker in installing the operation device 400.

This structure improves sealing between the bottom 4261 of the recess 4026 and the leading edge of the rib 186, and prevents water resulting from condensation on the head 19a of the screw 19 in the third space S3 from entering the second space S2 in a reliable manner.

Figure 23:
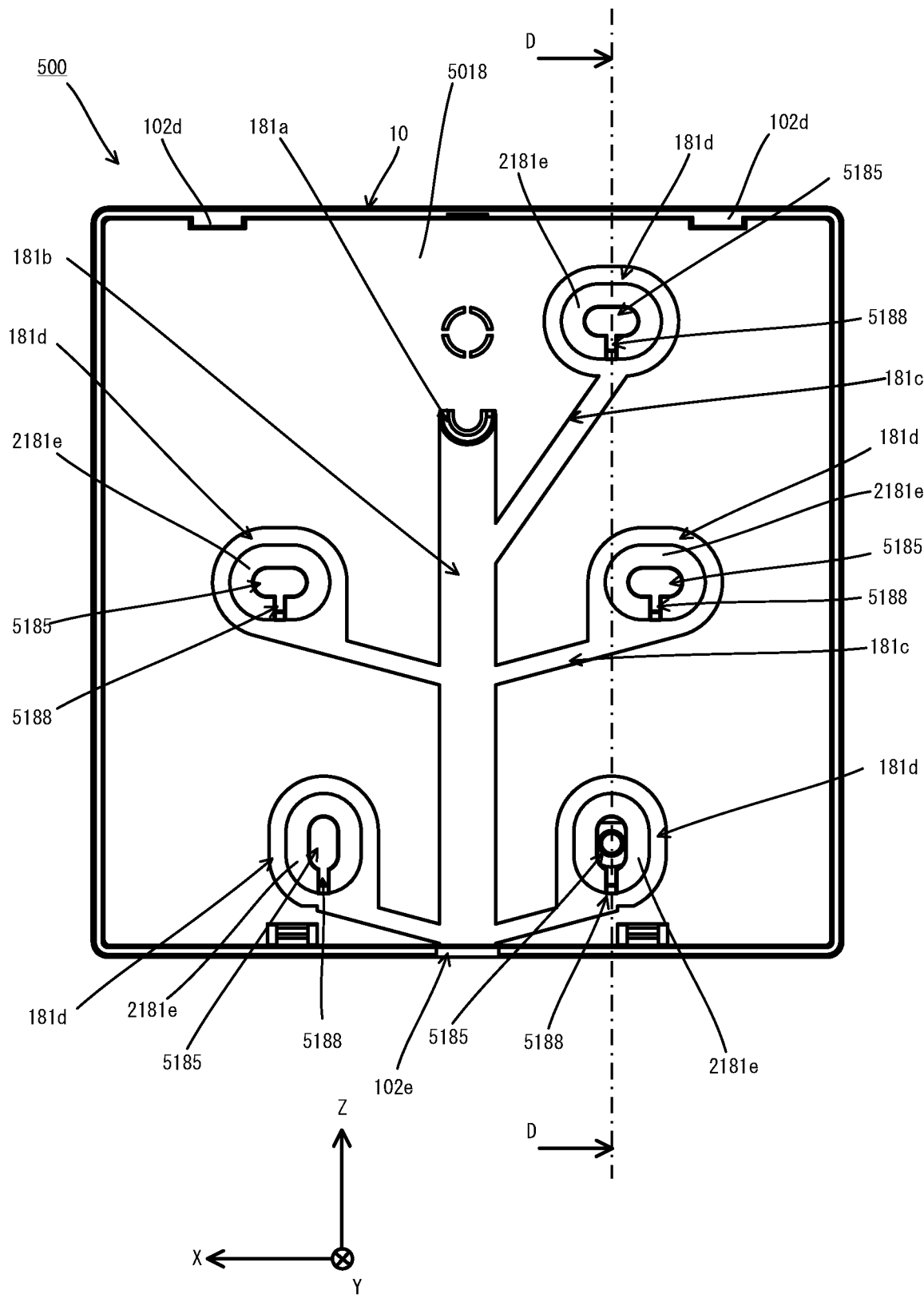
FIG. 23 is a plan view of an operation device viewed from the rear according to a modification.
Figure 24:
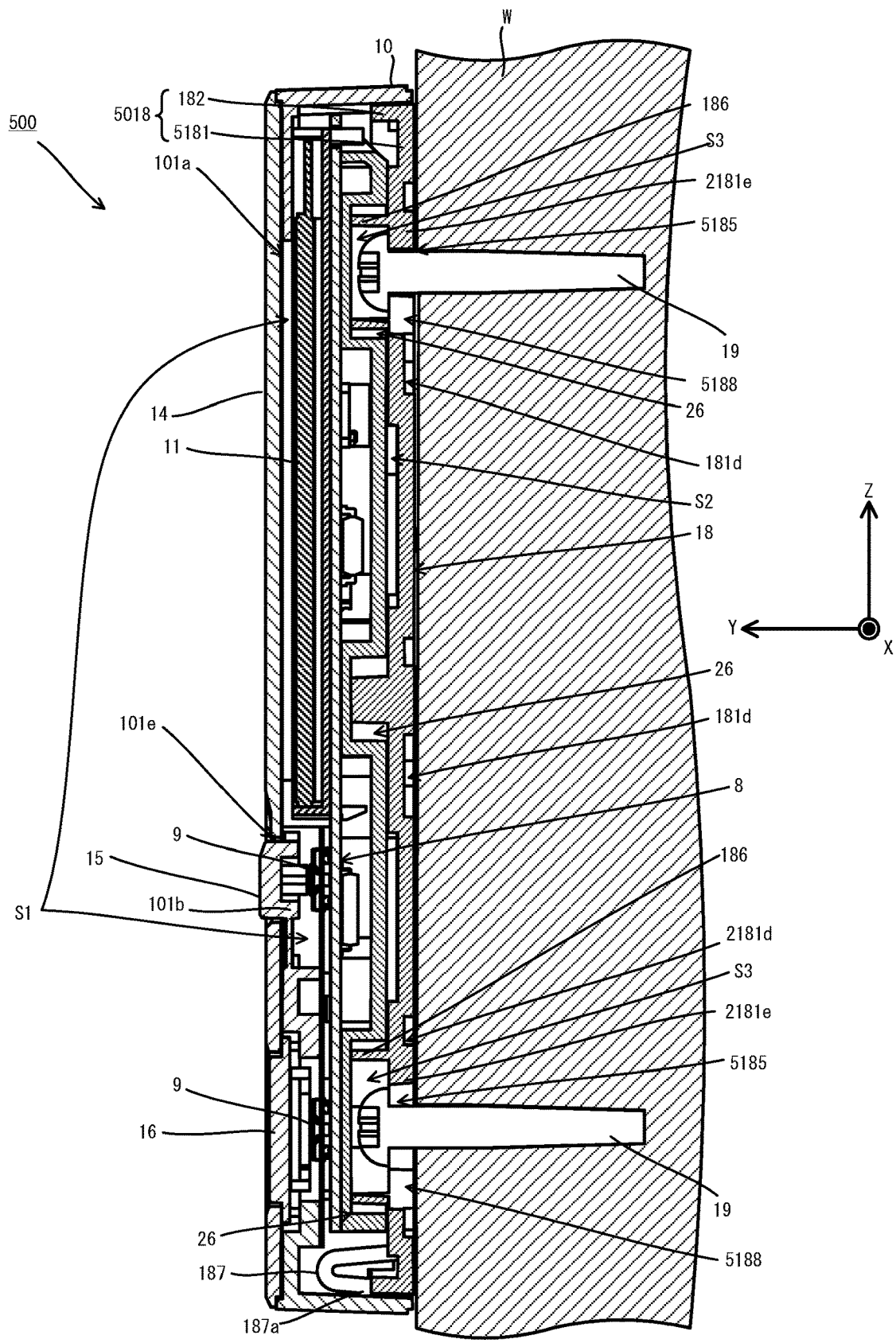
FIG. 24 is a cross-sectional view of an operation device according to a modification installed on a wall, taken along line D-D indicated by the arrows in FIG. 23.

The base member 2018 according to Embodiment 2 has, in addition to the installation hole 185, the communication hole 2188 that communicates with the third space S3 defined by the rib 2186 on the base member 2018 and the bottom of the recess 26 on the protective cover 2. The base member is not limited to this structure. For example, a base member 5018 may have communication grooves 5188 communicating with installation holes 5185, as shown in an operation device 500 in FIGS. 23 and 24. In FIG. 23, the same components as in Embodiment 2 are given the same reference numerals as in FIG. 18. The base member 5018 includes a rectangular plate bottom wall 5181, the peripheral wall 182 extending from the periphery of the bottom wall 5181, and a plurality of (five in FIG. 23) installation holes 5185 in the bottom wall 5181, like the base member 2018 described in Embodiment 2. As shown in FIG. 24, the base member 5018 further has communication grooves 5188 that are located farther in the −Z direction than the installation hole 5185 and communicate with the third space S3 in the −Y direction of the base member 5018. This allows water resulting from condensation on the head 19a of the screw 19 in the third space S3 to be drained out of the operation device 500 through the communication groove 5188.

In this structure, the base member 5018 has the communication grooves 5188 that are located farther in the −Z direction than the installation hole 5185 and communicate with the installation hole 5185. This allows water resulting from condensation on the head 19a of the screw 19 in the third space S3 to be drained out of the operation device 500 through the communication groove 5188, and reduces water retained in the third space S3 entering the second space S2 or the first space S1. This reduces malfunctioning of the operation device 500 due to such water entry.

Although the operation device 300 including the operation device body 3001 with no protective cover is described in Embodiment 3, the operation device is not limited to this structure. The operation device body may include a protective cover. In this structure, the protective cover may eliminate a recess, for example, like the recess 26 on the protective cover 2 according to Embodiment 1, which facilitates forming of the protective cover.

The operation device 300 according to Embodiment 3 may include an insulation sheet with electrical insulation properties between the control board 8 and the base member 3018 and between the control board 8 and the lid 3026. This structure prevents, for example, surge damage to the control board 8 due to a hand of a worker directly touching the control board 8 in mounting of the operation device body 3001 on the base member 3018 installed on the wall W.

In Embodiments 2 and 3 and modifications, the tip of the screw 19 longer than the thickness of the wall plate of the hollow wall (not shown) extends into the space inside the wall (not shown) when the operation device 200, 300, 400, or 500 is installed on the wall. In the operation device installed on the wall in this manner, cold air inside the wall may cool the air in the third space S3 in FIGS. 19, 22, and 24 and in the fourth space S4 in FIG. 20, as described in Embodiment 1.

Although the operation device is used to operate an air conditioner in Embodiments 1 to 3, the operation target of the operation device is not limited to an air conditioner and may include other household equipment.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure is suitable for an operation device used in an environment where condensation may occur on a screw for installing the operation device on a structural material.

The invention claimed is:

1. An operation device comprising:
a control board on which an electronic component is mounted;
a case accommodating the control board;
a base member to which the case is fastened, the base member having an installation hole to receive a screw for installation to a structural material and a rib having an annular shape and surrounding the installation hole; and
a protective cover located inside the case and separating, inside the case, a space defined by the base member and the case into a first space and a second space to protect the control board, the first space accommodating the control board, the second space being partially defined by the base member, wherein the protective cover has, on a surface facing the base member, a recess in an area corresponding to the rib, the rib is fitted in the recess with a leading edge of the rib in contact with a bottom of the recess, and a part of the screw inserted through the installation hole is located in a third space defined by the rib and the protective cover, and the third space is sealed from the first space by the protective cover to prevent condensation water from entering the first space.

2. The operation device according to claim 1, wherein the base member has a communication hole communicating with the third space and located vertically downward from the installation hole when the base member is installed on the structural material.

3. The operation device according to claim 2, wherein when the base member is installed on the structural material, a vertically downward inner wall of the rib and a vertically downward inner wall of the communication hole slope vertically downward toward the structural material.

4. The operation device according to claim 3, wherein the protective cover has at least a portion of elastic material, and the at least the portion of the elastic material of the protective cover is the bottom of the recess.

5. The operation device according to claim 4, wherein the base member has
   a dent surrounding the installation hole,
   a first groove extending in a first direction, and
   a second groove having a first end communicating with the first groove and a second end communicating with the dent, and when the base member is installed on the structural material with the first direction being vertically downward, the second end of the second groove is located farther in a second direction than the first end of the second groove, the second direction being opposite to the first direction.

6. The operation device according to claim 3, wherein the base member has
   a dent surrounding the installation hole,
   a first groove extending in a first direction, and
   a second groove having a first end communicating with the first groove and a second end communicating with the dent, and when the base member is installed on the structural material with the first direction being vertically downward, the second end of the second groove is located farther in a second direction than the first end of the second groove, the second direction being opposite to the first direction.

7. The operation device according to claim 2, wherein the protective cover has at least a portion of elastic material, and the at least the portion of the elastic material of the protective cover is the bottom of the recess.

8. The operation device according to claim 7, wherein the base member has
   a dent surrounding the installation hole,
   a first groove extending in a first direction, and
   a second groove having a first end communicating with the first groove and a second end communicating with the dent, and when the base member is installed on the structural material with the first direction being vertically downward, the second end of the second groove is located farther in a second direction than the first end of the second groove, the second direction being opposite to the first direction.

9. The operation device according to claim 2, wherein the base member has
   a dent surrounding the installation hole,
   a first groove extending in a first direction, and
   a second groove having a first end communicating with the first groove and a second end communicating with the dent, and when the base member is installed on the structural material with the first direction being vertically downward, the second end of the second groove is located farther in a second direction than the first end of the second groove, the second direction being opposite to the first direction.

10. The operation device according to claim 1, wherein the protective cover has at least a portion of elastic material, and the at least the portion of the elastic material of the protective cover is the bottom of the recess.

11. The operation device according to claim 10, wherein the base member has
   a dent surrounding the installation hole,
   a first groove extending in a first direction, and
   a second groove having a first end communicating with the first groove and a second end communicating with the dent, and when the base member is installed on the structural material with the first direction being vertically downward, the second end of the second groove is located farther in a second direction than the first end of the second groove, the second direction being opposite to the first direction.

12. The operation device according to claim 1, wherein the base member has
   a dent surrounding the installation hole,
   a first groove extending in a first direction, and
   a second groove having a first end communicating with the first groove and a second end communicating with the dent, and when the base member is installed on the structural material with the first direction being vertically downward, the second end of the second groove is located farther in a second direction than the first end of the second groove, the second direction being opposite to the first direction.

13. An operation device comprising:
a control board on which an electronic component is mounted;
a case accommodating the control board;
a base member to which the case is fastened, the base member having installation holes to receive screws for installation to a structural material and ribs each having an annular shape and surrounding the installation hole, each rib protruding in a direction opposite to the structural material when the base member is installed on the structural material; and
lids corresponding one-to-one to the ribs to each close a leading edge of the corresponding rib,
wherein, when the base member is installed on the structural material, a part of the each screw, which is inserted through a corresponding one of the installation holes, is located in a fourth space defined by the corresponding rib and the corresponding lid, and a ridge with a corrugated profile is provided in a portion of the ribs or the lids where the ribs and the lids face each other.

14. The operation device according to claim 13, wherein the base member has
- dents each surrounding a corresponding one of the installation holes,
- a first groove extending in a first direction, and
- second grooves each having a first end communicating with the first groove and a second end communicating with the corresponding dent, and when the base member is installed on the structural material with the first direction being vertically downward, the second end of each second groove is located farther in a second direction than the first end of each second groove, the second direction being opposite to the first direction.

* * * * *